(12) United States Patent
Takahashi et al.

(10) Patent No.: US 7,719,626 B2
(45) Date of Patent: May 18, 2010

(54) LIQUID CRYSTAL DISPLAY UNITS WITH DATA AND/OR ADDRESS LINES BEING FORMED OF COPPER ALLOY AND METHOD OF FABRICATING THE SAME

(75) Inventors: Takuya Takahashi, Hitachi (JP); Takaaki Suzuki, Kasama (JP)

(73) Assignee: Hitachi Displays, Ltd., Morbara-shi (JP)

( * ) Notice: Subject to any disclaimer, the term of this patent is extended or adjusted under 35 U.S.C. 154(b) by 174 days.

(21) Appl. No.: 12/119,547

(22) Filed: May 13, 2008

(65) Prior Publication Data
US 2008/0284935 A1    Nov. 20, 2008

(30) Foreign Application Priority Data
May 14, 2007    (JP)    ............................. 2007-128154

(51) Int. Cl.
*G02F 1/136* (2006.01)
(52) U.S. Cl. .............................. 349/46; 349/19; 349/33; 349/41; 349/42; 349/43
(58) Field of Classification Search .................... 349/19, 349/33, 41, 42, 43, 46
See application file for complete search history.

(56) References Cited

U.S. PATENT DOCUMENTS 7,633,164 B2 * 12/2009 Koike et al. .................. 257/762
2001/0038976 A1 * 11/2001 Tanabe et al. ............... 430/325

FOREIGN PATENT DOCUMENTS

WO    WO 2006/025347 A1    3/2006

OTHER PUBLICATIONS

Shigen-to-Sozai, Vo., 120 (2004) No. 4.5, pp. 310-313.

* cited by examiner

*Primary Examiner*—Jennifer Doan
(74) *Attorney, Agent, or Firm*—Antonelli, Terry, Stout & Kraus, LLP.

(57) ABSTRACT

Disclosed is a liquid crystal display device having a signal line of low electrical resistivity and high adhesion with an underlayer, wherein a copper alloy film is formed on an underlayer, and an oxide film, silicide film or nitride film, which are additive metal elements of the copper alloy, is formed at the boundary between the underlayer and the copper alloy film whereby the signal line is formed with a multilayer film of the copper alloy film and the oxide film, the silicide film, or the nitride film.

20 Claims, 14 Drawing Sheets

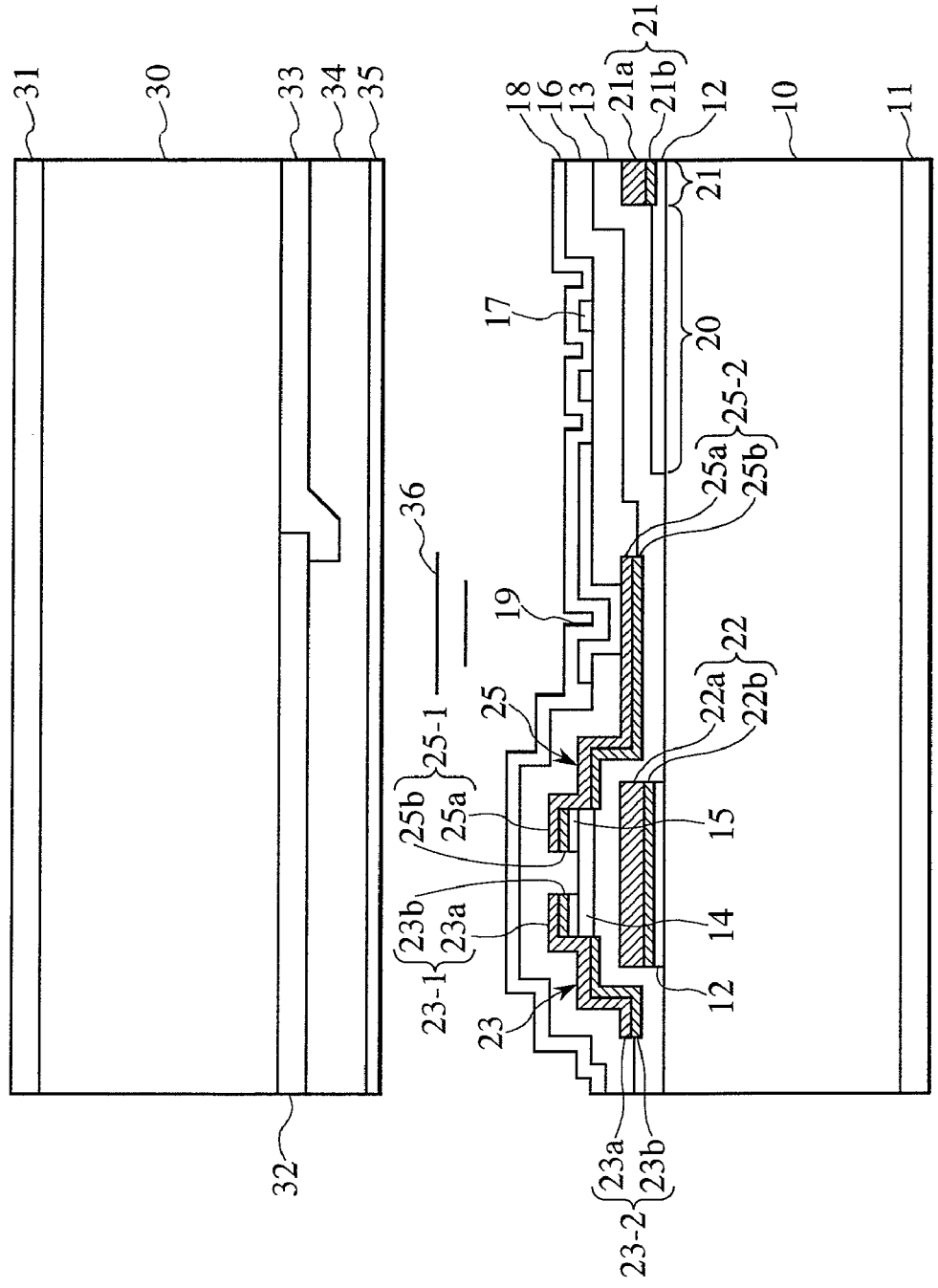

LIQUID CRYSTAL DISPLAY UNITS WITH DATA AND/OR ADDRESS LINES BEING FORMED OF COPPER ALLOY AND METHOD OF FABRICATING THE SAME

BACKGROUND OF THE INVENTION

1. Field of the Invention

The present invention relates to an active matrix type liquid crystal display device driven by a thin film transistor.

2. Description of the Related Art

Driving frequency has recently been made higher to improve motion picture quality in an active matrix type liquid crystal display device driven by a thin film transistor. Accordingly, it is essential to lower the resistance of signal lines. Further, the active matrix type liquid crystal display device is used for television receivers of a large size screen. Accordingly, reduction in cost is demanded and it is strongly required to keep production cost low.

To decrease the resistance of the signal line, a metal material of low electrical resistivity such as aluminum or copper may be used as a main wiring material. However, aluminum or copper cannot be used alone as the wiring material. For example, since aluminum cannot be in direct contact electrically with a transparent conductive film (generally, oxide mainly comprising indium) in a different layer and, accordingly, it is necessary to laminate a connection layer of molybdenum or titanium at the boundary between aluminum and the transparent conductive film. Further, since aluminum diffuses unnecessarily in silicon for forming a thin film transistor, it is necessary to laminate a barrier layer of molybdenum or titanium also to the boundary between aluminum and silicon. On the other hand, since copper also diffuses unnecessarily into silicon, a barrier layer has to be laminated at the boundary between copper and silicon. Further, since copper has weak adhesion force with an underlying layer, an adhesive layer has to be laminated at the boundary between copper and the underlayer.

As described above, when aluminum or copper is used as a material for signal lines of thin film transistor driven liquid crystal display devices, a barrier layer or an adhesive layer of molybdenum or titanium has to be laminated inevitably.

However, molybdenum and titanium not only contribute scarcely to the lowering of the resistance in the signal line but also are expensive compared with aluminum or copper. That is, they involve a problem not contributing to the reduction of the cost. Further, since a step of laminating the barrier layer or adhesive layer is necessary, this takes much time for film deposition treatment and requires expensive sputtering apparatus disposed additionally. Accordingly, this results in a drawback of increasing the installation investment in mass production factories.

An example of an aluminum alloy that can be used as a single layer signal line is disclosed in "Resource and Material" Vol. 120 (2004), p. 310. When the aluminum alloy is used for connection wiring between a thin film transistor and a pixel electrode in a liquid crystal panel, the productivity is improved. However, the lower limit of the electrical resistivity of the aluminum alloy is 3.7 μΩcm and it is difficult to further lower the electrical resistivity. Further, when the aluminum alloy is used alone, it cannot cope with a problem regarding long time reliability of signal lines such as stress migration.

WO 2006/025347A1 describes an example of a copper alloy that can be used as a single layer for a signal line of a liquid crystal display device. The absolute value of a Gibbs Free Energy of Formation of oxide or enthalpy of formation of oxide of additive metal element of the copper alloy is larger than that of copper, and the diffusion coefficient of the additive metal element in copper is larger than the self-diffusion coefficient of copper. The alloy film is annealed at 400° C., an oxide of an additive metal element is formed at a boundary with a silicon oxide as an underlayer. This improves the adhesion with the underlayer and the electrical resistivity which was higher before annealing can be lowered.

In WO 2006/025347A1, annealing is conducted at 400° C. However, the temperature in production process of a thin film transistor-driven liquid crystal display device using amorphous silicon is at about 300° C. or lower. Accordingly, it is necessary that the electrical resistivity is lowered sufficiently even by annealing at 300° C. An aimed value for the specific electrical resistivity is below 3.7 μΩcm which is the electrical resistivity of the aluminum alloy that can be used as a single layer described in "Resource and Material" cited above. The present inventors have made an experiment of conducting annealing at 300° C. As a result, the electrical resistivity of the copper alloy formed on the silicon oxide was not lowered sufficiently compared with that before annealing. If it is intended only to lower the electrical resistivity, the content of the additive metal element may be decreased, but this lowers the adhesion with the underlayer.

The present invention intends to provide, in a thin film transistor-driven liquid crystal display device, an interconnect structure capable of sufficiently lowering the electrical resistivity even by annealing at 300° C. and having high adhesion with an underlayer.

SUMMARY OF THE INVENTION

The present invention provides an active matrix type liquid display device driven by a thin film transistor in which at least one of a scanning signal line and a transparent common electrode includes a multi-layer film of a copper alloy film disposed on a transparent conductive film comprising indium oxide or a zinc oxide as a main ingredient, and an oxide film of an additive metal element of a copper alloy film formed at the boundary between the transparent conductive film and the copper alloy film.

(1) The diffusion coefficient of the additive metal element of the copper alloy film in copper is higher than the self-diffusion coefficient of copper and (2) a chemical potential of oxygen gas at equilibrium of oxidation of the additive metal element of the copper alloy film is lower than the chemical potential of oxygen gas at equilibrium of oxidation of indium or zinc. Further, (3) the solid solubility of the additive metal element of the copper alloy film in copper is greater than 0.1%.

According to the invention, the drain electrode and the source electrode include a multi-layer film of a copper alloy film disposed on a contact layer comprising n+ type amorphous silicon and a silicide film of an additive metal element of a copper alloy film formed at the boundary between the contact layer and the copper alloy film.

The diffusion coefficient of the additive metal element of the copper alloy film in copper is higher than the self-diffusion coefficient of copper and (2) the chemical potential of silicon at equilibrium of silicidation of the additive metal element of the copper alloy film is lower than the chemical potential of silicon at equilibrium of silicidation of copper. Further, (3) the solid solubility of the additive metal element of the copper alloy film 23a, 25a in copper is greater than 0.1%.

According to the invention, an image signal line includes a multi-layer film of a copper alloy film disposed on a gate insulative film comprising silicon nitride and a nitride film of an additive metal element of a copper alloy film formed at the boundary between the gate insulative film and the copper alloy film.

(1) The diffusion coefficient of the additive metal element of the copper alloy film in copper is higher than the self-diffusion coefficient of copper and (2) the chemical potential of nitrogen gas at equilibrium of nitridation of the additive metal element of the copper alloy film is lower than the chemical potential of nitrogen gas at equilibrium of nitridation of silicon, and Gibbs free energy of formation of a silicide is negative. Further, (3) the solid solubility of the additive metal element of the copper alloy film in copper is greater than 0.1%.

The present invention provides an interconnect structure, in a thin film transistor-driven liquid crystal display device, in which the electrical resistivity is lowered sufficiently even by annealing at 300° C. and adhesion with an underlayer is high.

BRIEF DESCRIPTION OF THE DRAWINGS

Other objects and advantages of the invention will become apparent from the following description of embodiments with reference to the accompanying drawings in which:

FIG. 1 is an enlarged cross sectional view for a main portion including a thin film transistor of a first embodiment of an active matrix type liquid crystal display device according to the invention;

DETAILED DESCRIPTION OF THE PREFERRED EMBODIMENTS

Figure 2A:
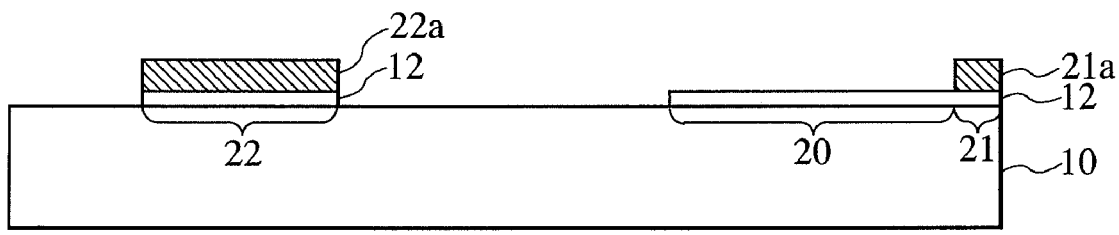
FIGS. 2A and 2B are views of assistance of explaining a first photolithographic step in a method of manufacturing a first embodiment of an active matrix type liquid crystal display device according to the invention.

Embodiments of an active matrix type liquid crystal display device driven by a thin film transistor according to the invention are to be described.

FIG. 1 shows a first embodiment of a liquid crystal display device according to the invention. FIG. 1 shows a portion of a thin film transistor of an active matrix type liquid crystal display device in an enlarged scale. The liquid crystal display device has an active matrix substrate and a color filter substrate between which liquid crystal 36 is sealed. On the inner surface of a glass substrate 30 for the color filter, a black matrix 32, a color filter 33, a leveling film 34, and an alignment film 35 are disposed. A polarizer film 31 is disposed on the outer surface of the glass substrate 30.

On the inner surface of a glass substrate 10 for use in an active matrix (hereinafter simply referred to as a substrate 10), are disposed a transparent common electrode 20, a common signal line 21, a scanning signal line 22, a gate insulative film 13, a protective insulative film 16, a pixel electrode 17 and an alignment film 18. On the other hand, a polarizer film 11 is disposed on the outer surface of the substrate 10.

The common signal line 21 extends in adjacent to and in parallel with the scanning signal line 22. The scanning signal lines 22 and image signal lines (not illustrated) intersect in a matrix form. The pixel electrode 17 and the transparent common electrode 20 are disposed in a pixel region surrounded by the scanning signal line 22 and the image signal line. A thin film transistor is formed corresponding to the intersection between the scanning signal line 22 and the image signal line. The thin film transistor has a drain electrode 23, a source electrode 25 and a gate electrode (also served as the scanning signal line 22). The pixel electrode 17 is connected by way of a through hole 19 to the source electrode 25 of the thin film transistor.

Unless otherwise specified, in the following descriptions, when the scanning signal line 22 is formed, the gate electrode and the scanning signal line terminal are formed simultaneously. When the drain electrode terminal is formed, the image signal line, the source electrode 25, the transparent common electrode 20, and the common signal line 21 are also formed.

The drain electrode 23 includes an electrode portion 23-1 formed by way of the contact layer 15 above the semiconductor layer 14 and a peripheral portion 23-2 at the periphery thereof. In the same manner, the source electrode 25 includes an electrode portion 25-1 formed by way of the contact layer 15 above the semiconductor layer 14 and a peripheral portion 25-2 at the outside thereof.

The transparent common electrode 20 is formed of a transparent conductive film 12 containing indium oxide or zinc oxide as a main ingredient. The gate insulative film 13 and the protection insulative film 16 are formed of silicon nitride SiN. The semiconductor layer 14 is formed of amorphous silicon a-Si. The contact layer 15 is formed of $n^+$ type amorphous silicon $n^+$a-Si. The pixel electrode 17 is formed of a transparent conductive film containing indium oxide or zinc oxide as a main ingredient.

The common signal line 21 and the scanning signal line 22 include copper alloy films 21a, 22a above the transparent conductive film 12 and metal oxide films 21b, 22b formed at the boundary between the transparent conductive film 12 and the copper alloy films 21a, 22a.

The drain electrode portion 23-1 and the source electrode portion 25-1 include copper alloy films 23a, 25a formed above the contact layer 15 and metal silicide films 23b, 25b formed at the boundary between the contact layer 25 and the copper alloy films 23a, 25a.

The drain electrode peripheral portion 23-2 and the source electrode peripheral portion 25-2 include the copper alloy films 23a, 25a above the gate insulative film 13 and the metal nitride films 23b, 25b formed at the boundary between the gate insulative film 13 and the copper alloy films 23a, 25a.

In one embodiment of the invention, the transparent conductive film 12 is formed of indium oxide. The common signal line 21 and the scanning signal line 22 are prepared by forming the copper alloy films 21a and 22a respectively above the transparent conductive film 12 containing indium oxide. In this embodiment, (1) the diffusion coefficient of the additive metal element of the copper alloy films 21a, 22a in copper is higher than the self-diffusion coefficient of copper and (2) the chemical potential of oxygen gas at equilibrium of oxidation of the additive metal element of the copper alloy films 21a, 22a is lower than the chemical potential of oxygen gas at equilibrium of oxidation of indium. Further, (3) the solid solubility of the additive metal element of the copper alloy film 21a, 22a in copper is greater than 0.1%. The chemical potential of oxygen gas at equilibrium of oxidation is defined as $P_0$ according to the following formula:

$$P_0 = 2\Delta G_0/n_0 \qquad \text{formula (1)}$$

in which $\Delta G_0$ is Gibbs free energy of formation of oxide and $n_0$ is the number of moles of oxygen atoms in the oxide.

The additive metal element in the copper alloy films 21a and 22a are moved by diffusion to the boundary respectively between the copper alloy films 21a, 22a and the transparent conductive film 12, where the element is chemically bonded with oxygen contained in the transparent conductive film 12 (indium oxide) to form metal oxide films 21b, 22b.

The transparent conductive film 12 and the transparent common electrode 20 may be any material so long as it contains indium oxide as a main ingredient, and indium tin oxide, indium zinc oxide, or indium tin zinc oxide may be used. As the additive metal element of the copper alloy, one or more elements selected from elements of the first group consisting of aluminum, beryllium, chromium, gallium, magnesium, manganese, titanium, vanadium, and zinc may be selected and used. Most preferred is manganese or magnesium. In the case where the additive metal element of the copper alloy is magnesium (Mg), the reaction of forming the metal oxide films 21b, 22b is represented by the following reaction scheme.

$$In_2O_3 + 3Mg \rightarrow 2In + 3MgO \qquad \text{formula (2)}$$

Thus, in this embodiment, the oxide films 21b, 22b of the additive metal elements of the copper alloy are formed at the boundary between the indium oxide (transparent conductive film 12) and the copper alloy films 21a, 22a. Accordingly, the common signal line 21 and the scanning signal line 22 include a multi-layer film of the copper alloy films 21a and 22a respectively formed above the transparent conductive film 12 comprising indium oxide as a main ingredient and the metal oxide films 21b and 22b formed at the boundary between the copper alloy film and the transparent conductive film.

In this embodiment, a signal line connected firmly to the underlying transparent conductive film 12 and at a low electrical resistivity is obtained. Further, in the case where the metal oxide films 21b, 22b have electroconductivity, electroconduction can be established between the common signal line 21 and the scanning signal line 22 and the underlying transparent conductive film 12.

In one embodiment of the invention, the transparent conductive film 12 is formed of zinc oxide. The common signal line 21 and the scanning signal line 22 are prepared by forming the copper alloy films 21a and 22a respectively above the transparent conductive film 12 containing zinc oxide.

According to this embodiment, (1) the diffusion coefficient of the additive metal element of the copper alloy films 21a, 22a in copper is higher than the self-diffusion coefficient of copper and (2) the chemical potential of oxygen gas at equilibrium of oxidation of the additive metal element of the copper alloy films 21a, 22a is lower than the chemical potential of oxygen gas at equilibrium of oxidation of zinc. Further, (3) the solid solubility of the additive metal element of the copper alloy films 21a, 22a in copper is greater than 0.1%. Further, the chemical potential of oxygen gas at equilibrium of oxidation gas is defined as $P_0$ of the formula 1.

The additive metal element in the copper alloy films 21a and 22a move by diffusion to the boundary respectively between the copper alloy film 21a, 22a and the transparent conductive film 12, where the element is chemically bonded with oxygen contained in the transparent conductive film 12 (zinc oxide) to form the metal oxide films 21b and 22b.

The transparent conductive film 12 and the transparent common electrode 20 may be any materials so long as it includes zinc oxide as a main ingredient, and zinc aluminum oxide or zinc gallium oxide may be used. As the additive metal elements of the copper alloy, one or more elements selected from the second group consisting of aluminum, beryllium, chromium, gallium, magnesium, manganese, titanium, and vanadium may be selected and used. Most preferred are manganese or magnesium. In the case where the additive metal element of the copper alloy is manganese (Mn), the reaction forming the metal oxide films 21b, 22b is represented by the following reaction scheme.

$$ZnO + Mn \rightarrow Zn + MnO \qquad \text{formula (3)}$$

Thus, in this embodiment, the oxide films 21b and 22b of the additive metal elements of the copper alloy are formed at the boundary between the zinc oxide (transparent conductive film 12) and the copper alloy films 21a and 22a. Accordingly, the common signal line 21 and the scanning signal line 22 include a multi-layer film of the copper alloy films 21a and 22a respectively formed above the transparent conductive film 12 comprising zinc oxide as a main ingredient and the metal oxide films 21b and 22b formed at the boundary between the copper alloy and the transparent conductive film.

In this embodiment, a signal line connected firmly to the underlying transparent conductive film 12 and at a low electrical resistivity is obtained. Further, in the case where the metal oxide films 21b, 22b have electroconductivity, electroconduction can be established between the common signal line 21 and the scanning signal line 22 and the underlying transparent conductive film 12.

In the two embodiments described above, to decrease the electrical resistivity of the signal line to 3.7 μΩcm or lower by annealing at 300° C., it is preferred to restrict the content of the additive metal element of the copper alloy to 2 at % or less. Further, to attain better adhesion of the signal line to the underlayer, it is preferred to restrict the content of the additive metal element to 0.5 at % or more and 3 at % or less. After all, in order to ensure both the lowering of the electrical resistivity and favorable adhesion to the underlayer of the signal line, it is preferred to define the content of the additive metal element of the copper alloy to 0.5 at % or more and 2 at % or less. The thickness of the metal oxide films 21b, 22b is preferably within a range from 0.5 nm to 3 nm.

In one embodiment of the invention, the drain electrode portion 23-1 and the source electrode portion 25-1 are prepared respectively by forming the copper alloy films 23a and 25a on the contact layer 15 of n⁺ type amorphous silicon.

According to this embodiment, (1) the diffusion coefficient of the additive metal element of the copper alloy films 23a, 25a in copper is higher than the self-diffusion coefficient of copper and (2) the chemical potential of silicon at equilibrium of silicidation of the additive metal element of the copper alloy films 23a, 25a is lower than the chemical potential of silicon at equilibrium of silicidation of copper. Further, (3) the solid solubility of the additive metal element of the copper alloy films 23a, 25a in copper is greater than 0.1%.

In the electrode portion of the thin film transistor, the additive metal element in the copper alloy films 23a, 25a move by diffusion to the boundary between the copper alloy films 23a, 25a and the contact layer 15 respectively, where the element is chemically bonded with silicon contained in the contact layer 15 (n⁺ type amorphous silicon) to form the metal silicide films 23b and 25b.

As the additive metal element of the copper alloy, one or more elements may be selected for use from elements of the third group consisting of chromium, magnesium, manganese, titanium and vanadium. Most preferred are manganese or magnesium. In the case where the additive metal element of the copper alloy is manganese (Mn), the reaction forming the metal silicide films 23b, 25b is represented by the following reaction scheme.

$$Si+Mn \rightarrow MnSi \qquad \text{formula (4)}$$

Thus, in this embodiment, silicide films 23b and 25b of the additive metal element of the copper alloy are formed at the boundary between the n⁺ type amorphous silicon (contact layer 15) and the copper alloy films 23a and 25a. Accordingly, the drain electrode portion 23-1 and the source electrode portion 25-1 include respectively a multi-layer film of the copper alloy films 23a and 25a formed above the contact layer 15 comprising the n⁺ type amorphous silicon, and the metal silicide films 23b and 25b formed at the boundary between the contact layer 15 and the copper alloy films 23a and 25a.

In this embodiment, a signal line firmly connected to the underlying n⁺ type amorphous silicon and at a low electrical resistivity is obtained. Further, diffusion of copper of the copper alloy films 23a, 25a into the n⁺ type amorphous silicon can be suppressed.

In one embodiment of the invention, the drain electrode peripheral portion 23-2 and the source electrode peripheral portion 25-2 are prepared respectively by forming the copper alloy films 23a and 25a above the gate insulative film 13 comprising silicon nitride. According to this embodiment, (1) the diffusion coefficient of the additive metal element of the copper alloy films 23a, 25a in copper is higher than the self-diffusion coefficient of copper and (2) the chemical potential of nitrogen gas at equilibrium of nitridation of the additive metal element of the copper alloy films 23a and 25b is lower than the chemical potential of nitrogen gas at equilibrium of nitridation of silicon, and Gibbs free energy of formation of the silicide is negative. Further, (3) the solid solubility of the additive metal element of the copper alloy films 23a, 25a in copper is greater than 0.1%. The chemical potential of nitrogen gas at equilibrium of nitridation is defined as $P_N$ according to the following formula.

$$P_N = 2\Delta G_N / n_N \qquad \text{formula (5)}$$

in which $\Delta G_N$ is Gibbs free energy of formation of the nitride, and $n_N$ is the number of moles of nitrogen atoms of the nitride. In the nitride in the periphery of the thin film transistor, the additive metal element of the copper alloy films 23a and 25a moves respectively by diffusion to the boundary between the copper alloy films 23a and 25a and the gate insulative film 13, where the element is chemically bonded with nitrogen contained in the gate insulative film 13 (silicon nitride) to form metal nitride films 23b and 25b.

As the additive metal element of the copper alloy, one or more elements may be selected for use from elements of the fourth group consisting of aluminum, beryllium, magnesium, titanium, and vanadium. Most preferred are aluminum or magnesium. In the case where the additive metal element of the copper alloy is magnesium (Mg), the reaction for forming the metal nitride films 23b, 25b is represented by the following reaction scheme.

$$Si_3N_4 + 6Mg \rightarrow 3Si + 2Mg_3N_2 \qquad \text{formula (6)}$$

Thus, in this embodiment, the nitride films 23b and 25b of the additive metal element of the copper alloy are formed respectively at the boundary between the silicon nitride (gate insulative film 13) and the copper alloy films 23a, 25a. Accordingly, the drain electrode peripheral portion 23-2 and the source electrode peripheral portion 25-2 include a multi-layer film of the copper alloy films 23a, 25a formed above the gate insulative layer 13 comprising the silicon nitride and the metal nitride films 23b, 25b formed at the boundary between the gate insulative layer 13 and the copper alloy films 23a, 25a.

In this embodiment, a signal line firmly connected to the underlying silicon nitride and at a low electrical resistivity is obtained. Further, diffusion of copper of the copper alloy films 23a, 25a into the silicon nitride can be suppressed.

In the case where the underlayer comprises amorphous silicon, the additive metal element of the copper alloy film is selected from elements of the third group, that is, chromium, magnesium, manganese, titanium, and vanadium. On the other hand, in the case where the underlayer is silicon nitride, the additive metal element of the copper alloy film is selected from elements of the fourth group, that is, aluminum, beryllium, magnesium, titanium, and vanadium. However, in the underlayer of the image signal line in the liquid crystal display device, both of the amorphous silicon and the silicon nitride are often present. In such a case, as the additive metal element of the copper alloy film, an element in common with the third group and fourth group may be selected. The elements in common with the third group and the fourth group are referred to as the fifth group. In the case where both the amorphous silicon and the silicon nitride are present as the underlayer, the additive metal element of the copper alloy film is selected from elements of the fifth group, that is, magnesium, titanium, and vanadium.

Further, it is effective for improved productivity in mass production to use materials and processing processes in common for the image signal line and the scanning signal line in the liquid crystal display device. In view of the above, as the additive metal element of the copper alloy film for forming the image signal line and the scanning signal line, elements in common with the elements of the first group or the second group and the elements of the fifth group may be selected. The elements satisfying such a condition are magnesium, titanium, and vanadium which are elements of the fifth group.

A manufacturing method of a first embodiment for active matrix substrate of a liquid crystal display device according to the invention shown in FIG. 1 is to be described with reference to FIG. 2 to FIG. 6. The manufacturing method of this embodiment includes five photolithography steps. FIG. 2A to FIG. 6A show a thin film transistor and a pixel region in a state where each of photolithographic steps is completed and a photoresist is stripped and FIG. 2B to FIG. 6B show the flow of manufacturing steps. The photolithography includes forming a metal thin film on a substrate, coating a photoresist thereon, irradiating a light by way of a mask thereby selectively exposing the resist, developing the same thereby forming a resist pattern, removing a metal from a region other than the resist pattern by etching and, finally, stripping remaining resist. The first to fifth photolithographic steps to be described below basically include such processings.

Figure 2B:
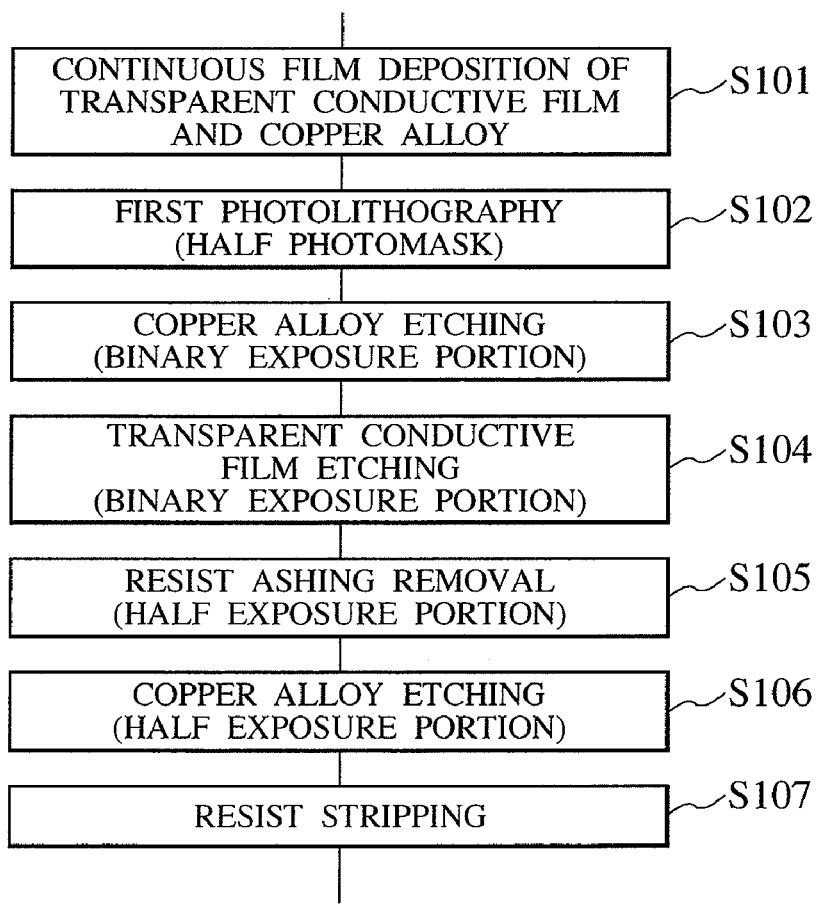

A first photolithographic step is to be explained with reference to FIGS. 2A and 2B. A transparent conductive film 12 and first copper alloy films 21a, 22a are formed in the first photolithographic step. At step S101, a transparent conductive film 12 comprising an indium oxide or a zinc oxide is formed by sputtering. As the indium oxide, indium tin oxide, indium zinc oxide, or indium tin zinc oxide is used and, as the zinc oxide, zinc aluminum oxide or zinc gallium oxide is used. The thickness of the transparent conductive film 12 is from 10 nm to 150 nm, and about 50 nm is preferred. Successively, the first copper alloy films 21a, 22a are formed by sputtering.

The copper alloy includes manganese as an additive metal element. Instead of manganese, an element selected from elements of the first group, that is, aluminum, beryllium, chromium, gallium, manganese, titanium, vanadium, and zinc may also be used. In the case where the transparent conductive film 12 comprises the zinc oxide, an element selected from the elements of the second group, that is, aluminum, beryllium, chromium, gallium, manganese, titanium, and vanadium may also be used. The thickness of the copper alloy films 21a, 22a is from 100 nm to 500 nm and it is 400 nm in this embodiment.

At step S102, a resist pattern is formed by using a half photo-mask. Exposure is not conducted to a region for forming the scanning signal line 22 and the common signal line 21, and a thick resist is formed. Half exposure is applied to a region for forming the transparent common electrode 20 to form a thin resist. Usual exposure is applied to the region other than the region for forming the scanning signal line 22, the common signal line 21, and the transparent common electrode 20, and the resist is removed by development.

At step S103, the copper alloy film in the region removed with the resist, that is, the region other than the region for forming the scanning signal line 22, the common signal line 21, and the transparent common electrode 20 is removed by the etching. At step S104, the transparent conductive film in the region removed with the resist, that is, in the region other than the region for forming the scanning signal line 22, the common signal line 21, and the transparent common electrode 20 is removed by etching.

At step S105, the resist in the half exposure portion is stripped by ashing. That is, the resist in the region for forming the transparent common electrode 20 is stripped. At step S106, the copper alloy film of the half exposure portion is removed by etching. That is, the copper alloy film in the region for forming the transparent common electrode 20 is removed. The resist is stripped at step S107. That is, the resist in the region for forming the scanning signal line 22 and the common signal line 21 is stripped.

Thus, with the steps of from step S101 to step S107, the transparent electroconductive film 12 and the first copper alloy films 21a, 22a are formed in the region for forming the scanning signal line 22 and the common signal line 21 above the substrate 10. Further, the transparent conductive film 12 is formed in the region where the transparent common electrode 20 is formed above the substrate 10.

Figure 3A:
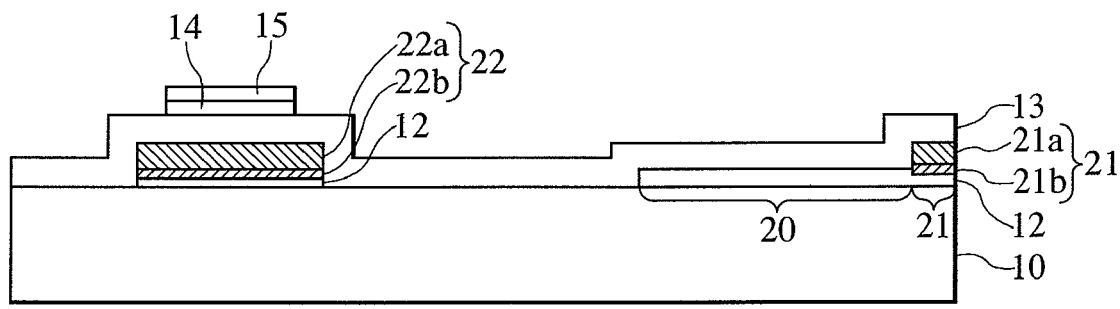
FIGS. 3A and 3B are views of assistance of explaining a second photolithographic step in a method of manufacturing a first embodiment of an active matrix type liquid crystal display device according to the invention.
Figure 3B:
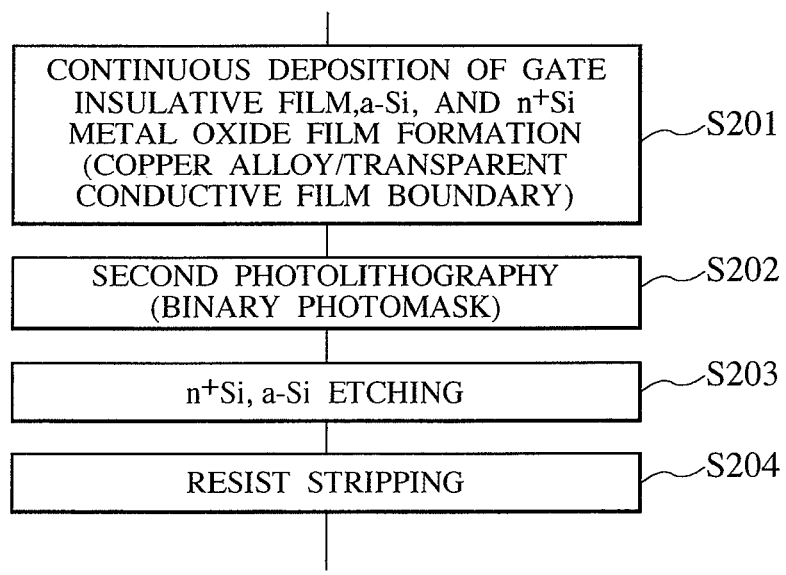

A second photolithographic step is to be described with reference to FIGS. 3A and 3B. With the second photolithographic step, a gate insulative film 13, a semiconductor layer 14, and a contact layer 15 are formed and, at the same time, oxide films 21b, 22b of the additive metal element of the copper alloy are formed. At step S201, a silicon nitride film as a starting material for the gate insulative film 13, an amorphous silicon film as a starting material for the semiconductor layer 14, and an n⁺ type amorphous silicon film as a starting material for the contact layer 15 are formed successively in this order by a plasma-enhanced chemical vapor deposition. The film forming temperature in the step S201 is about 300° C. In this step, the oxide films 21b, 22b of the additive metal element of the copper alloy film are formed at the boundary between the transparent conductive film 12 and the first copper alloy films 21a, 22a formed in the first photolithographic step. In this embodiment, the oxide films 21b, 22b are manganese oxide films.

At step S202, a resist pattern is formed by using a binary photo-mask. The binary exposure means usual exposure and development without using half exposure. That is, a resist is formed in a region for forming the semiconductor region 14 and the contact layer 15 and the resist in other regions is removed. At step S203, the multi-layer film of the n⁺ type amorphous silicon film and the amorphous silicon film in the region removed with the resist, that is, in the region other than the region for forming the semiconductor layer 14 and the contact layer 15 is removed by etching. At step S204, the resist in the region for forming the semiconductor layer 14 and the contact layer 15 is stripped. Thus, as shown in FIG. 3A, an island pattern having the semiconductor layer 14 and the contact layer 15 is formed above the gate insulative film 13.

Figure 4A:
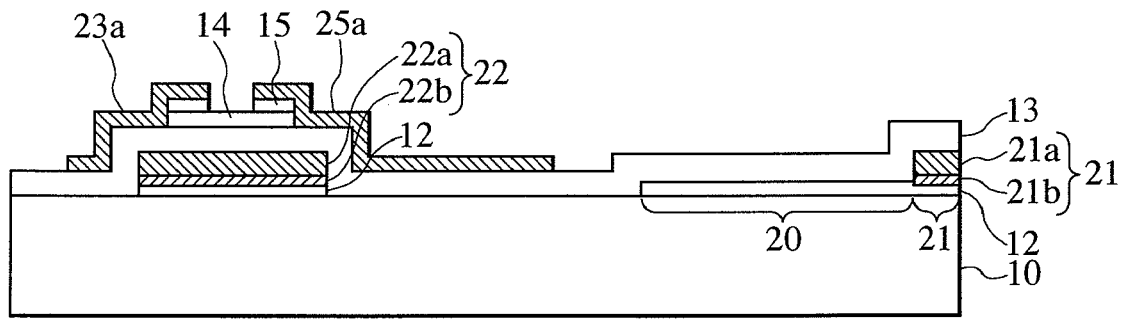
FIGS. 4A and 4B are views of assistance of explaining a third photolithographic step in a method of manufacturing a first embodiment of an active matrix type liquid crystal display device according to the invention.
Figure 4B:
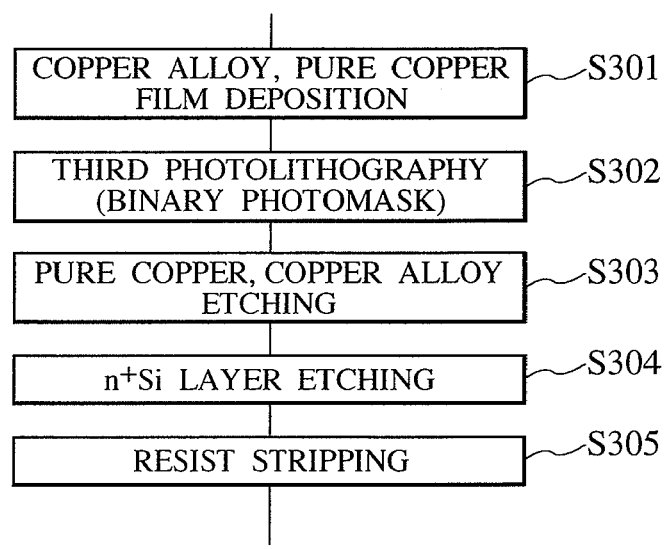

Referring to FIGS. 4A and 4B, a third photolithographic step is to be described. Second copper alloy films 23a and 25a are formed in the third photolithographic step. At step S301, a copper alloy film with magnesium as the additive metal element and a pure copper film are formed in this order successively by sputtering. As the additive metal element of the copper alloy, elements of the fifth group, that is, titanium or vanadium may be selected instead of magnesium.

At step S302, a resist pattern is formed by using a binary photo-mask. That is, a resist is formed in a region for forming the drain electrode 23 and a source electrode 25 and the resist in other region is removed. At step S303, the multi-layer film of the copper alloy film and the pure copper film in the region removed with the resist, that is, in the region other than the region for forming the drain electrode 23 and the source electrode 25 is removed by etching. At step S304, the n⁺ type amorphous silicon film is removed in the region for forming the channel portion. At step S305, the resist in the region for forming the drain electrode and the source electrode 25 is stripped. Thus, as shown in FIG. 4A, a multi-layer film of the copper alloy films 23a, 25a and a pure copper film (not illustrated) is formed in a region for forming the drain electrode 23 and the source electrode 25.

Figure 5A:
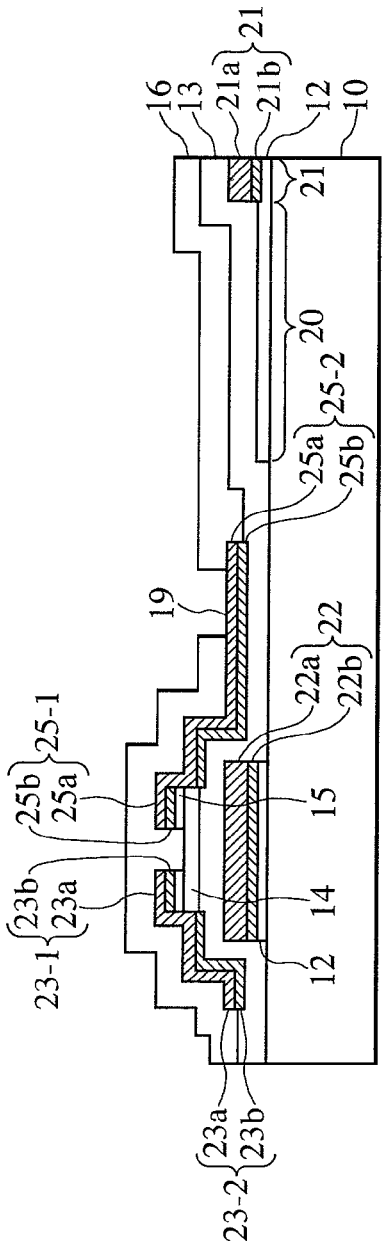
FIGS. 5A and 5B are views of assistance of explaining a fourth photolithographic step in a method of manufacturing a first embodiment of an active matrix type liquid crystal display device according to the invention.
Figure 5B:
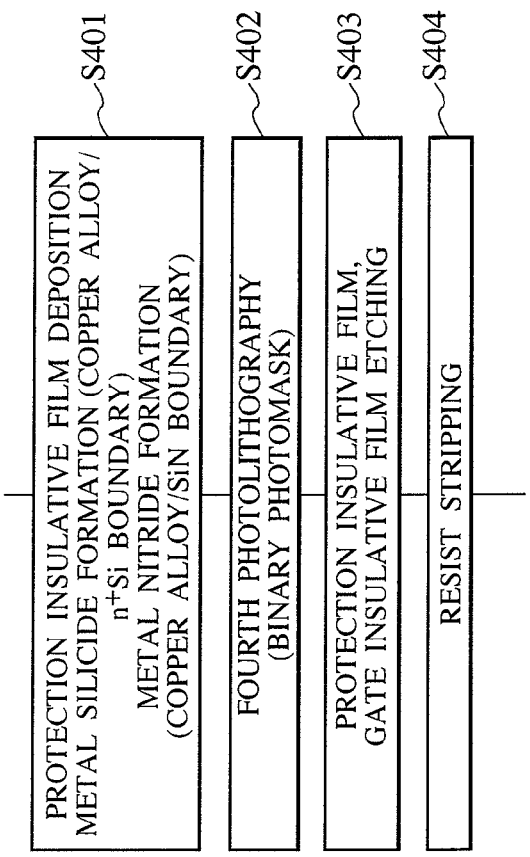

A fourth photolithographic step is to be described with reference to FIGS. 5A and 5B. With the fourth photolithographic step, a protection insulative film 16 and a through hole 19 are formed and, at the same time, silicide films 23b, 25b of the additive metal element of the copper alloy and nitride films 21b, 22b are formed. At step S401, a silicon nitride film as a starting material for the protection insulative film 16 is formed by plasma-enhanced chemical vapor deposition. The film forming temperature is about 230° C. In this step, silicide films 23b, 25b of magnesium as the additive metal element of the copper alloy are formed in the region for forming a drain electrode portion 23-1 and a source electrode portion 25-1 at the boundary between the contact layer 15 formed in the second photolithographic step (FIG. 3A) and the second copper alloy films 23a, 25a formed in the third photolithographic step (FIG. 4A). Further, nitride films 23b, 25b of magnesium of the additive metal element of the copper alloy are formed in the region for forming a drain electrode peripheral portion 23-2 and a source electrode peripheral portion 25-2 at the boundary between the gate insulative film 13 formed in the second photolithographic step (FIG. 3A) and the second copper alloy films 23a, 25a formed in the third photolithographic step (FIG. 4A).

At step S402, a resist pattern is formed by using a binary photomask. That is, a resist is formed in a region other than the region for forming the through hole 19 and the resist in the region for forming the through hole 19 is removed by etching. At step S403, the silicon nitride film is removed in the region removed with the resist, that is, in the region for forming the through hole 19 to form an opening. At step S404, the resist in the region other than the region for forming the through hole 19 is stripped. Then, as shown in FIG. 5A, the protection insulative film 16 and the opening for the through hole 19 are formed.

Figure 6A:
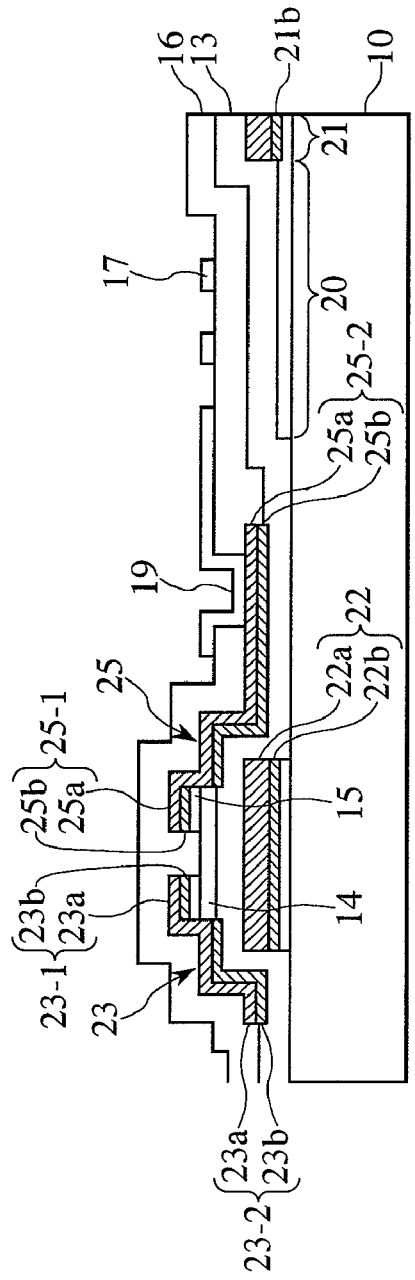
FIGS. 6A and 6B are views of assistance of explaining a fifth photolithographic step in a method of manufacturing a first embodiment of an active matrix type liquid crystal display device according to the invention.
Figure 6B:
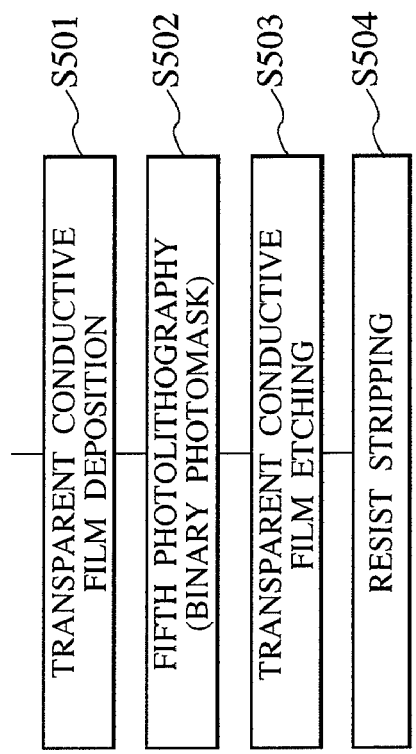

A fifth lithographic step is to be described with reference to FIGS. 6A and 6B. With the fifth lithographic step, a pixel electrode 17, a scanning signal line terminal (not illustrated), a common signal line terminal (not illustrated), and an image signal line terminal (not illustrated) are formed. At step S501, a transparent conductive film comprising an indium oxide or zinc oxide as a starting material for the pixel electrode 17 is formed by sputtering. At step S502, a resist pattern is formed by using a binary photomask. That is, a resist is formed in a region for forming the pixel electrode, the scanning signal line terminal, the common signal line terminal, and the drain electrode terminal, and the resist in other region is removed. At step S503, the transparent conductive film in the region removed with the resist, that is, the region other than the region for forming the pixel electrode 17, the scanning signal line terminal, the common signal line terminal, and the image signal line terminal is removed. At step S504, the resist is stripped. Thus, as shown in FIG. 6A, the pixel electrode 17, the scanning signal line terminal, the common signal line terminal, and the image signal line terminal are formed. Finally, as shown in FIG. 1, the aligned film 18 is formed thereby manufacturing an active matrix substrate of the liquid crystal display device.

Figure 11A:
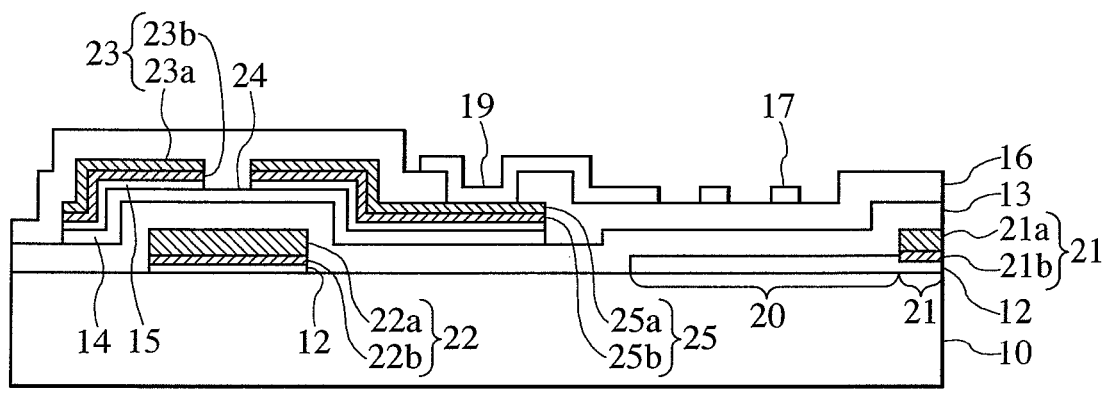
FIGS. 11A and 11B are views of assistance of explaining a main portion of a thin film transistor of a second embodiment of an active matrix type liquid crystal display device according to the invention and a fifth photolithographic step for a manufacturing method thereof.

FIG. 11A shows a second embodiment of a liquid crystal display device of the invention. In the drawing, only the active matrix substrate is shown. On the inner surface of a substrate 10, a transparent common electrode 20, a common signal line 21, a scanning signal line 22, a gate insulative film 13, a protection film 16, and a pixel electrode 17 are disposed. An alignment film is disposed on the innermost surface and a polarizer film is disposed on the outer surface of the active matrix substrate but they are not illustrated.

The common signal line 21 extends in adjacent to and in parallel with the scanning signal line 22. The scanning signal lines 22 and image signal lines (not illustrated) intersect in a matrix form. The pixel electrode 17 and the transparent common electrode 20 are disposed in a pixel region surrounded by the scanning signal line 22 and the image signal line. A thin film transistor is formed corresponding to the intersection between the scanning signal line 22 and the image signal line. The thin film transistor has a drain electrode 23, a source electrode 25 and a gate electrode. The pixel electrode 17 is connected by way of a through hole 19 to the source electrode 25 of the thin film transistor.

In this embodiment, the semiconductor layer 14 extends below the drain electrode 23 and the source electrode 25 and over the entire portion thereof. Further, the contact layer 15 extends below the drain electrode 23 and the source electrode 25 excepting for a channel portion 24 and over the entire portion thereof.

The common signal line 21 and the scanning signal line 22 are prepared by the same method as in the first embodiment. In this embodiment, the drain electrode 23 and the source electrode 25 are to be described.

According to this embodiment, the drain electrode 23 and the source electrode 25 are prepared by forming copper alloy films 23a, 25a above the contact layer 15 formed of $n^+$ type amorphous silicon. According to this embodiment, (1) the diffusion coefficient of the additive metal element of the copper alloy films 23a, 25a in copper is larger than the self-diffusion coefficient of copper and (2) Gibbs free energy of formation of the silicide of the additive metal element of the copper alloy film 23a, 25a is negative. Further, (3) the solid solubility of the additive metal element of the copper alloy films 23a, 25a in copper is greater than 0.1%.

The additive metal element in the copper alloy films 23a, 25a move by diffusion to the boundary respectively between the copper alloy films 23a, 25a and the contact layer 15, where the element is chemically bonded with silicon contained in the contact layer 15 ($n^+$ type amorphous silicon) to form the metal silicide films 23b and 25b.

As the additive metal element of the copper alloy, one or more elements selected from the elements of the third group, that is, from chromium, magnesium, manganese, titanium, and vanadium may be used. Most preferred are manganese or magnesium. In the case where the additive metal element of the copper alloy is manganese (Mn), the reaction forming the metal silicide films 23b, 25b is represented by the following reaction scheme.

$$Si+Mn \rightarrow MnSi \quad \text{formula (7)}$$

Thus, in this embodiment, the silicide films 23b, 25b of the additive metal element of the copper alloy are formed at the boundary between the $n^+$ type amorphous silicon (contact layer 15) and the copper alloy films 23a, 25a respectively. Accordingly, the drain electrode 23 and the source electrode 25 include a multi-layer film of the copper alloy films 23a, 25a formed above the contact layer 15 comprising the $n^+$ type amorphous silicon and the metal silicide films 23b, 25b formed at the boundary between the contact layer 15 and the copper alloy films 23a, 25a.

In this embodiment, a signal line firmly connected to the underlying $n^+$ type amorphous silicon and at a low electrical resistivity is obtained. Further, diffusion of copper of the copper alloy films 23a, 25a into $n^+$ type amorphous silicon can be suppressed.

Figure 10A:
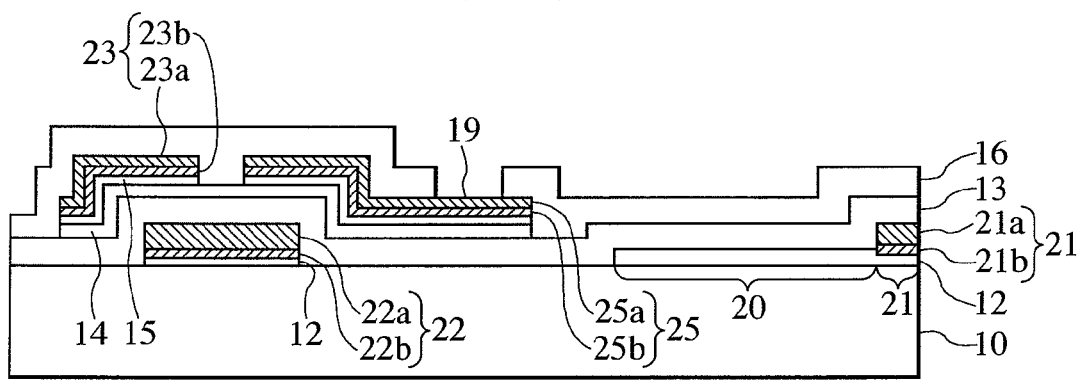
FIGS. 10A and 10B are views of assistance of explaining a fourth photolithographic step in a method of manufacturing a second embodiment of an active matrix type liquid crystal display device according to the invention.
Figure 10B:
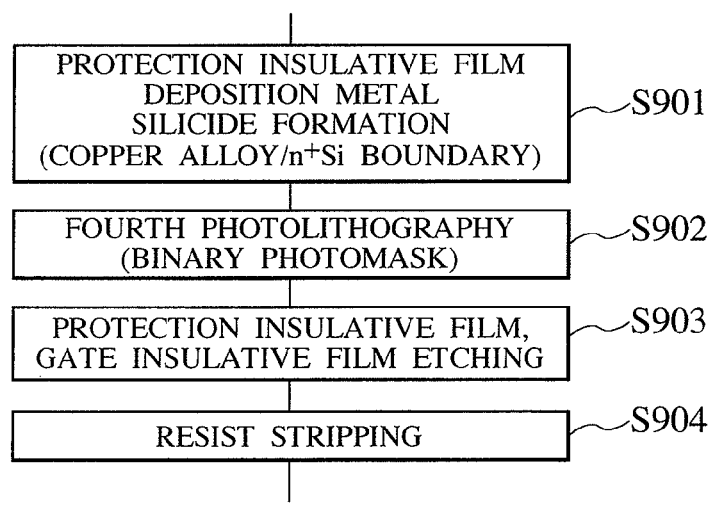
Figure 11B:
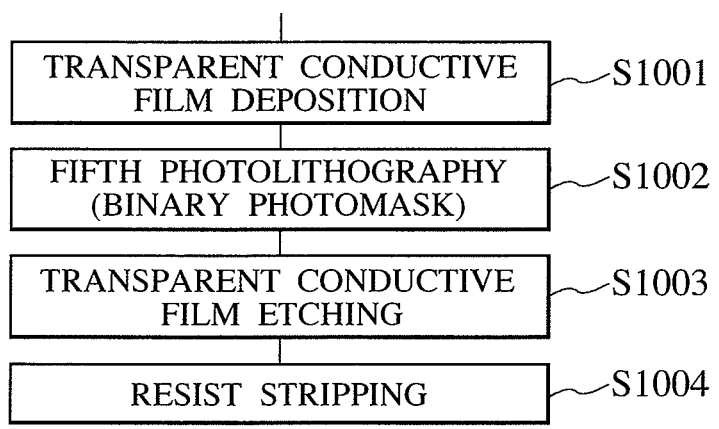

A manufacturing method of a second embodiment for an active matrix substrate of a liquid crystal display device according to the invention shown in FIGS. 11A and 11B is to be described with reference to FIG. 7A to FIG. 11B. The manufacturing method of this embodiment includes four photolithography steps. FIG. 7A to FIG. 11A show a thin film transistor and a pixel region in a state where each of photolithographic steps is completed and a photoresist is stripped and FIG. 7B to FIG. 11B show the flow of manufacturing steps. The photolithography includes forming a metal thin film on a substrate, coating a photoresist thereon, irradiating a light by way of a mask thereby selectively exposing the resist, developing the same thereby forming a resist pattern, removing a metal from a region other than the resist pattern by etching and, finally, stripping remaining resist. The first to fourth photolithographic steps to be described below basically include such processings.

A first photolithographic step is to be described with reference to FIGS. 7A and 7B. A transparent conductive film 12 and a first copper alloy films 21a, 22a are formed in the first photolithographic step. The first photolithographic step in FIG. 7B may be identical with the first photolithographic step in FIG. 2B. That is, processings in step S601 to S607 included in the first photolithographic step in FIG. 7B may be identical with those in step S101 to step S107 included in the first photolithographic step of FIG. 2B.

Figure 7A:
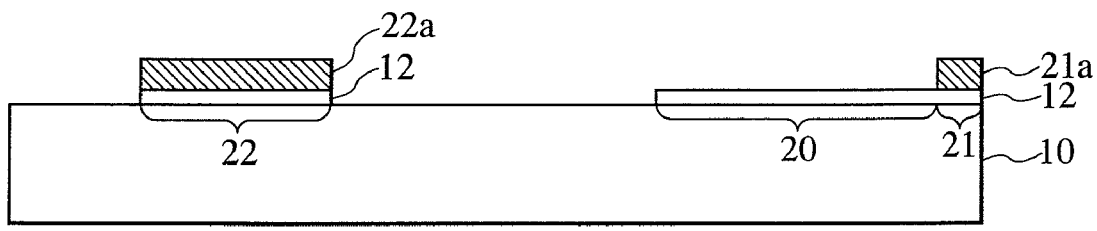
FIGS. 7A and 7B are views of assistance of explaining a first photolithographic step in a method of manufacturing a second embodiment of an active matrix type liquid crystal display device according to the invention.
Figure 7B:
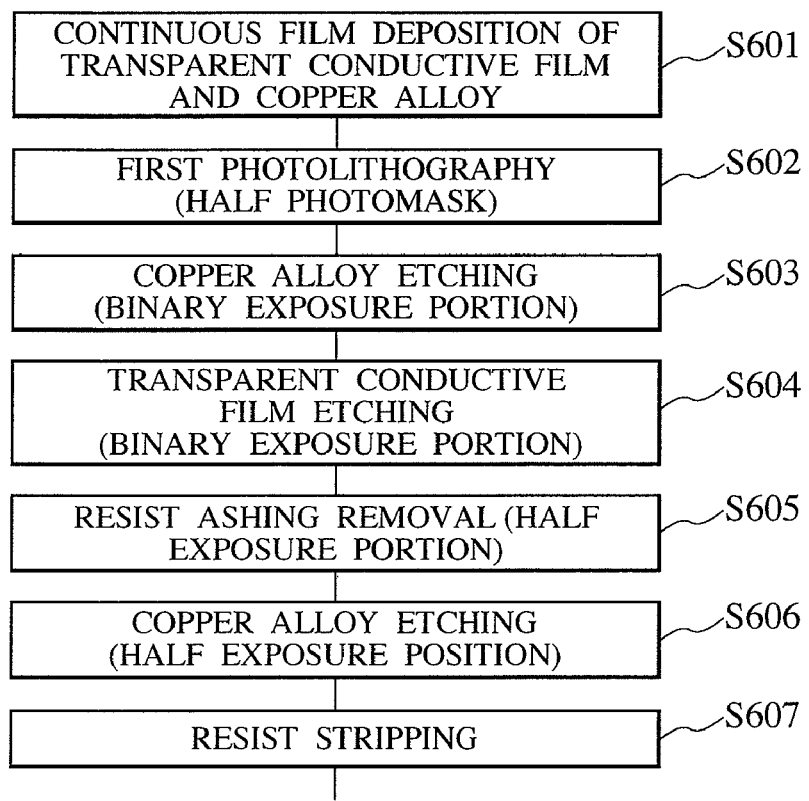

Thus, as shown in FIG. 7A, by the steps from step S601 to step S607, the transparent conductive film 12 and the first copper alloy films 21a, 22a are formed in the region for forming the scanning signal line 22 and the common signal line 21 above the substrate 10. Further, the transparent conductive film 12 is formed in the region where the transparent common electrode 20 is formed above the substrate 10.

A second photolithographic step is to be described with reference to FIGS. 8A and 8B. With the second photolithographic step, a gate insulative film 13, a semiconductor layer 14, a contact layer 15, and second copper alloy films 23a, 25a are formed and, at the same time, oxide films 21b, 22b of the additive metal element of the copper alloy are formed.

At step S701, a silicon nitride film as a starting material for the gate insulative film 13, an amorphous silicon film as a starting material for the semiconductor layer 14, and an n+ type amorphous silicon film as a starting material for the contact layer 15 are formed in this order successively by plasma-enhanced chemical vapor deposition. The film forming temperature was about 300° C. With the step, the oxide films 21b, 22b of the additive metal element of the copper alloy film are formed at the boundary between the transparent conductive film 12 and the first copper alloy films 21a, 22a formed in the first photolithographic step. In this embodiment, the oxide films 21b, 22b are manganese oxide films.

Then, second copper alloy films 23a, 25a with manganese as the additive metal element and a pure copper film are formed successively in this order by sputtering. As the additive metal element of the copper alloy, chromium, magnesium, titanium, or vanadium may be selected instead of manganese.

At step S702, a resist pattern is formed by using a half photomask. Exposure is not conducted to the region for forming the drain electrode 23 (including image signal line, image signal line terminal) and the source electrode 25, and a thick resist is formed. Half exposure is applied to the region for forming a channel portion 24 between the drain electrode 23 and the source electrode to form a thin resist. Usual exposure is applied to the region other than the region for forming the semiconductor layer 14, the contact layer 15, and the drain electrode 23 and the source electrode 25 thereabove, and the resist is removed by development.

At step S703, the pure copper film and the second copper alloy film in the region removed with the resist are removed by etching. At step S704, the n+ type amorphous silicon film in the region removed with resist and the amorphous silicon film are removed by etching.

At step S705, the resist in the half exposure portion is stripped by ashing. That is, the resist in the region for forming the channel portion 24 is stripped. At step S706, the pure copper film and the copper alloy film in the region for forming the channel portion 24 are removed. Further, the n+ type amorphous silicon film in the region for forming the channel portion 24 is removed by etching. At step S707, the resist is stripped. That is, the resist in the region for forming the drain electrode 23 (including image signal line and image signal line terminal) and the source electrode 25 is stripped.

Figure 8A:
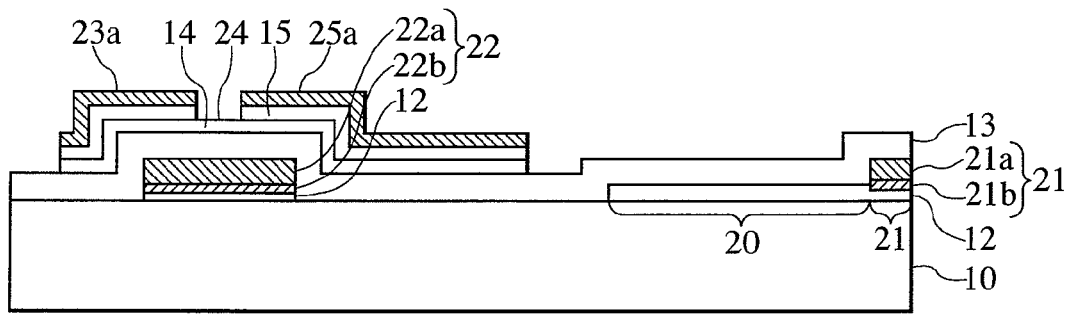
FIGS. 8A and 8B are views of assistance of explaining a second photolithographic step in a method of manufacturing a second embodiment of an active matrix type liquid crystal display device according to the invention.

Thus, as shown in FIG. 8A, the semiconductor layer 14, the contact layer 15, the drain electrode 23 and the source electrode 25 are formed above the gate insulative film 13.

Figure 8B:
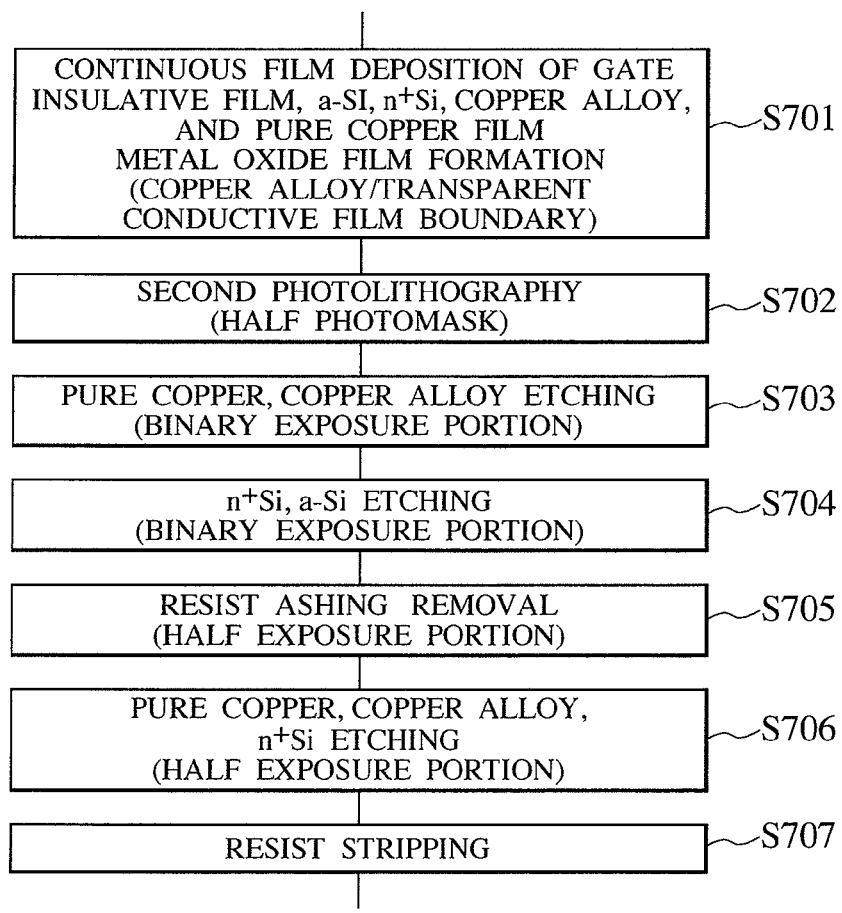
Figure 9A:
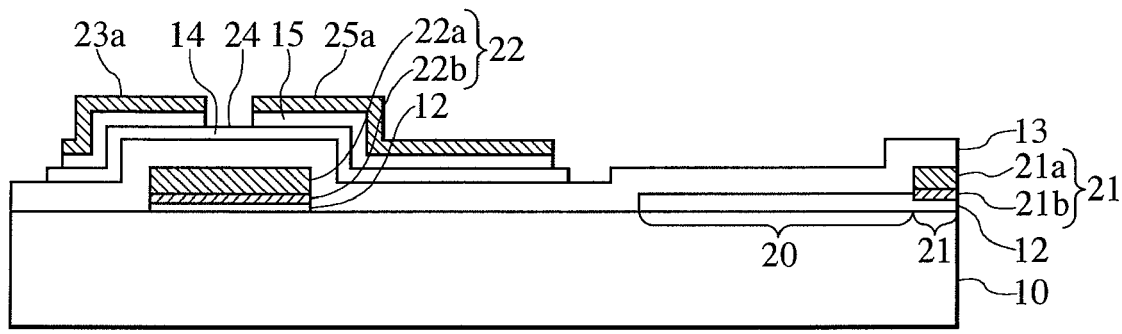
FIGS. 9A and 9B are views of assistance of explaining a third photolithographic step in a method of manufacturing a second embodiment of an active matrix type liquid crystal display device according to the invention.
Figure 9B:
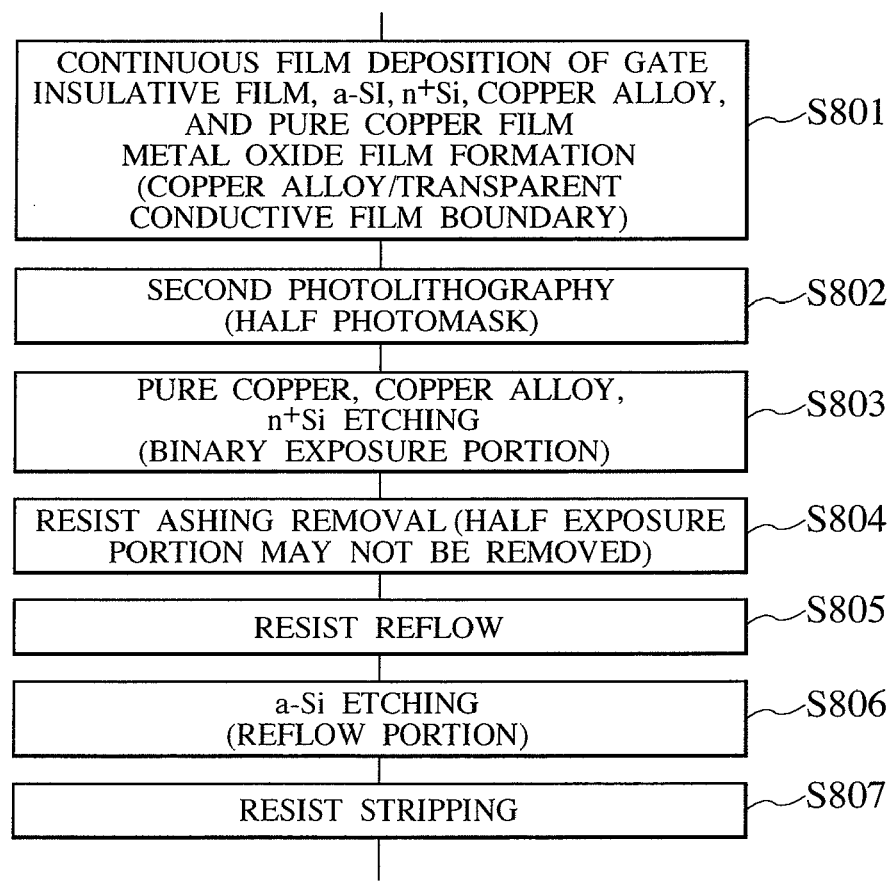

FIGS. 9A and 9B show a modified example of the second photolithographic step shown in FIGS. 8A and 8B. That is, a second photolithographic step shown in FIG. 9B may be used instead of the second photolithographic step shown in FIG. 8B. The second photolithographic step shown in FIG. 9B is to be described. Step S801 is identical with step S701.

At step S802, a resist pattern is formed by using a half photo-mask. In this embodiment, exposure is not conducted to a region for forming the drain electrode 23 and the source electrode 25, and a thick resist is formed. Half exposure is applied to a region for forming the image signal line and the image signal line terminal to form a thin resist.

At step S803, the pure copper film and the second copper alloy film in the region removed with the resist are removed by etching. Further, the n+ type amorphous silicon film in the region removed with the resist, that is, in the region removed with the pure copper film and the second copper alloy film is removed by etching. Thus, a channel portion of the thin film transistor is formed.

At step S804, the resist in the half exposure portion is removed by ashing. However, the step may not be performed. At step S805, resist reflow is conducted to fill a region for forming the channel portion 24 of the thin film transistor with the resist. At step S806, the amorphous silicon layer in the region removed with the resist is removed by etching. At step S807, the resist is stripped A third photolithographic step is to be described with reference to FIGS. 10A and 10B. With the third photolithographic step, a protection insulative film 16 and a through hole 19 are formed and, at the same time, silicide films 23b, 25b of manganese as the addition metal element of the copper alloy are formed.

At step S901, a silicon nitride film as a starting material for the protection insulative film 16 is formed by plasma-enhanced chemical vapor deposition. The film forming temperature is about 230° C. In this step, the silicide films 23b, 25b of manganese as the additive metal element of the copper alloy are formed in the region for forming the drain electrode 23 and the source electrode 25 at the boundary between the contact layer 15 and the second copper alloy films 23a, 25a formed in the second photolithographic step (FIG. 8B, FIG. 9B).

At step S902, a resist pattern is formed by using a binary photomask. That is, a resist is formed to a region other than the region for forming the through hole 19 and the resist in the region for forming the through hole 19 is removed. At step S903, the silicon nitride film is removed in the region removed with the resist, that is, in the region for forming the through hole by etching, to form an opening. At step S904, the resist in the region other than the region for forming the through hole 19 is stripped. Thus, as shown in FIG. 10A, the protection insulative film 16 and an opening for the through hole 19 are formed.

A fourth photolithographic step is to be described referring to FIGS. 11A and 11B. With the fourth photolithographic step, a pixel electrode 17, a scanning signal line terminal (not illustrated), a common signal line terminal (not illustrated), an image signal line terminal (not illustrated) are formed. The fourth photolithographic step in FIG. 11B may be identical with the fifth photolithographic step in FIG. 6B. That is, processing in step S1001 to step S1004 included in the fifth photolithographic step of FIG. 11B may be identical with those in step S101 to step S504 included in the fifth photolithographic step in FIG. 6B.

Thus, with the steps from step S1001 to step S1004, as shown in FIG. 11A, the pixel electrode 17, the scanning signal line terminal, the common signal line terminal, and the image signal line terminal are formed. Finally, as shown in FIG. 1, by forming the alignment film 18, an active matrix substrate for a liquid crystal display device is manufactured.

Structures and manufacturing methods of third, fourth and fifth embodiments of the active matrix substrates of the liquid crystal display device according to the invention are to be described with reference to FIG. 12 to FIG. 14. In the liquid crystal display device of these embodiments, the liquid crystal is driven by a vertical electric field. The position for the pixel electrode 17 is different in three embodiments shown in FIG. 12 to FIG. 14.

Figure 12:
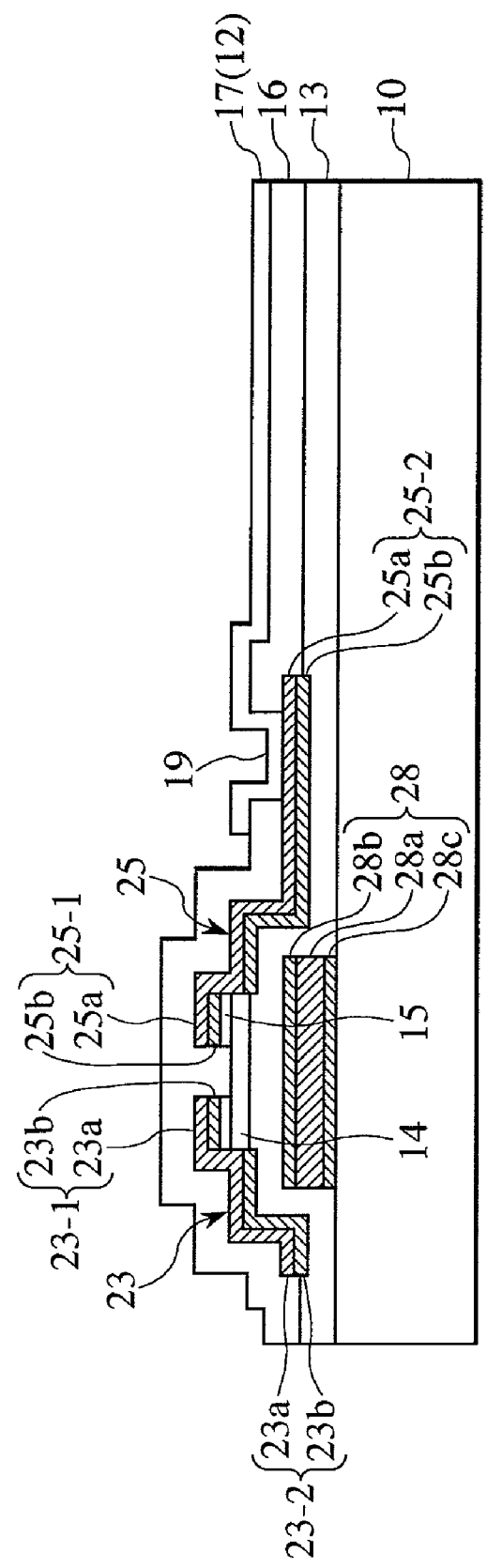
FIG. 12 is an enlarged cross sectional view for a main portion including a thin film transistor of a third embodiment of an active matrix type liquid crystal display device according to the invention.
Figure 13:
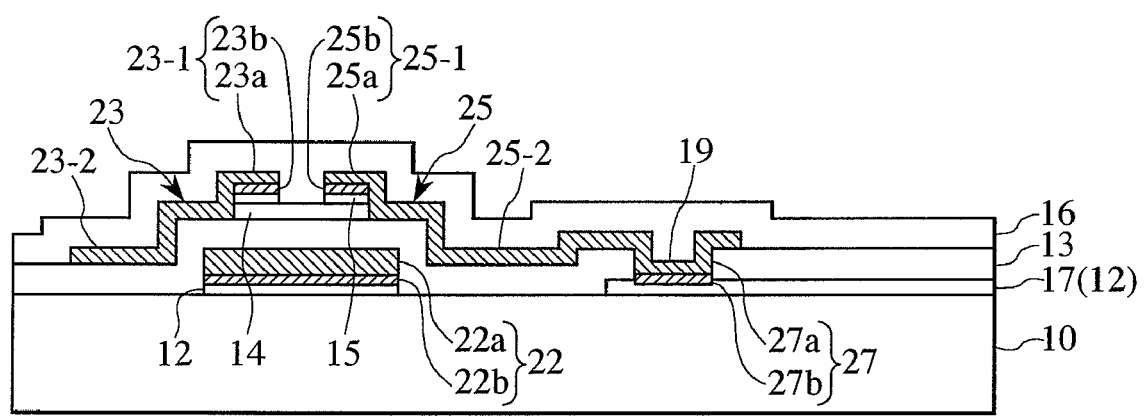
FIG. 13 is an enlarged cross sectional view for a main portion including a thin film transistor of a fourth embodiment of an active matrix type liquid crystal display device according to the invention.
Figure 14:
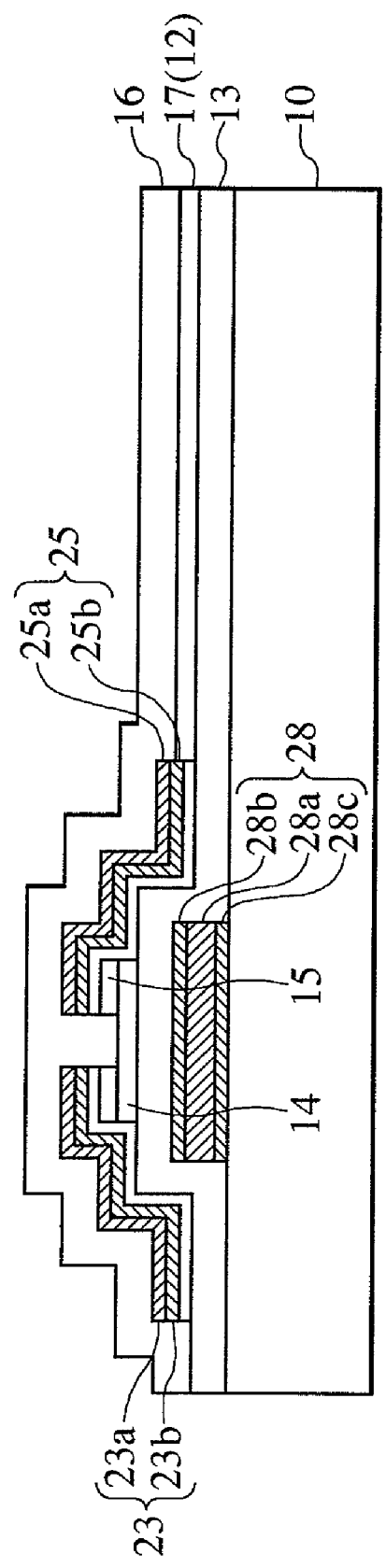
FIG. 14 is an enlarged cross sectional view for a main portion including a thin film transistor of a fifth embodiment of an active matrix type liquid crystal display device according to the invention.

In a third embodiment shown in FIG. 12, the pixel electrode 17 is disposed on a protection insulative film 16, disposed between a substrate 10 and a gate insulative film 13 in a fourth embodiment shown in FIG. 13, and disposed between a gate insulative film 13 and a protection insulative film 16 in a fifth embodiment shown in FIG. 14. The pixel electrode 17 is formed of a transparent conductive film 12 comprising an indium oxide or a zinc oxide. The indium oxide may be selected from indium tin oxide, indium zinc oxide, or indium tin zinc oxide. As the zinc oxide, zinc aluminum oxide or zinc gallium oxide may be selected.

At first, the third embodiment is to be described with reference to FIG. 12. On the inner surface of the substrate 10 in this embodiment, a scanning signal line 28, a gate insulative film 13, a protection insulative film 16, and a pixel electrode 17 are disposed. An alignment film is disposed on the innermost surface and a polarizer film is disposed on the outer surface of the active matrix substrate. They are not illustrated.

A thin film transistor is formed corresponding to an intersection between the scanning signal line 28 and an image signal line. The thin film transistor has a drain electrode 23, a source electrode 25, and a gate electrode (also served as the scanning signal line 28). The pixel electrode 17 is connected by way of a through hole 19 to the source electrode 25 of the thin film transistor.

The drain electrode 23 includes an electrode portion 23-1 formed by way of the contact layer 15 above the semiconductor layer 14 and a peripheral portion 23-2 at the periphery thereof. In the same manner, the source electrode 25 includes an electrode portion 25-1 formed by way of the contact layer 15 above the semiconductor layer 14 and a peripheral portion 25-2 to the outside thereof.

The gate insulative film 13 and the protection insulative film 16 are formed of silicon nitride $Si_3N_4$. The semiconductor layer 14 is formed of amorphous silicon a-Si. The contact layer 15 is formed of $n^+$ type amorphous silicon $n^+$ a-Si.

The scanning signal line 28 includes a copper-magnesium alloy film 28a above the glass substrate 10, a magnesium oxide film 28c formed at the boundary between the copper-magnesium alloy film 28a and the glass substrate 10, and a magnesium nitride film 28b formed at the boundary between the copper-magnesium alloy film 28a and the gate insulative film 13.

The scanning signal line 28 is prepared by forming the copper alloy film 28a on the glass substrate 10. According to this embodiment, (1) the diffusion coefficient of the additive metal element of the copper alloy film 28a in copper is higher than the self-diffusion coefficient of copper and (2) the chemical potential of oxygen gas at equilibrium of oxidation of the additive metal element of the copper alloy film 28a is lower than the chemical potential of oxygen gas at equilibrium of oxidation of silicon.

Further, (3) the solid solubility of the additive metal element of the copper alloy film 28a in copper is greater than 0.1%. Further (4) the chemical potential of oxygen gas at equilibrium of nitridation of the additive metal element of the copper alloy film 28a is lower than the chemical potential of oxygen gas at equilibrium of nitridation of silicon.

The additive metal element in the copper alloy film 28a moves by diffusion to the boundary between the copper alloy film 28a and the glass substrate 10, where the element is chemically bonded with oxygen contained in the glass substrate 10 (silicon oxide) to form the metal oxide film 28c.

As the additive metal element of the copper alloy, one or more elements may be selected for use from elements of the sixth group consisting of aluminum, beryllium, magnesium, and titanium. Manganese is most preferred. In the case where the additive metal element of the copper alloy is magnesium (Mg), the reaction forming the metal oxide film 28c is represented by the following reaction scheme.

$$SiO_2 + 2Mg \rightarrow Si + 2MgO \qquad \text{formula (8)}$$

The additive metal element in the copper alloy film 28a moves by diffusion to the boundary between the copper alloy film 28a and the gate insulative film 13, where the element is chemically bonded with nitrogen contained in the gate insulative film 13 (silicon nitride) to form the metal nitride film 28b.

In the case where the additive metal element of the copper alloy is magnesium (Mg), the reaction forming the metal nitride film 28b is represented by the following reaction scheme.

$$Si_3N_4 + 6Mg \rightarrow 3Si + 2Mg_3N_2 \qquad \text{formula (9)}$$

Thus, in this embodiment, the oxide film 28c of the additive metal element of the copper alloy is formed at the boundary between the glass substrate and the copper alloy film 28a, and the nitride film 28b of the additive metal element of the copper alloy is formed at the boundary between the copper alloy film 28a and the gate insulative film 13. Accordingly, the scanning signal line 28 includes a multi-layer film of the oxide film 28c of the additive element metal element of the copper alloy, the copper alloy film 28a, and the nitride film 28b of the additive metal element of the copper alloy.

The drain electrode portion 23-1 and the source electrode portion 25-1 include a magnesium silicide films 23b and 25b formed respectively at the boundary between the copper-magnesium alloy films 23a, 25a and the copper-magnesium alloy films 23a, 25a above the contact layer 15 and the contact layer 15 ($n^+$ type amorphous silicon).

Magnesium in the copper-magnesium alloy films 23a, 25a moves by diffusion to the boundary between the copper-magnesium alloy film 23a, 25a and the contact layer 15, where the element is chemically bonded with silicon contained in the contact layer 15 (n⁺ type amorphous silicon) to form magnesium silicide films 23b, 25b.

The drain electrode peripheral portion 23-2 and the source electrode peripheral portion 25-2 include copper-magnesium alloy films 23a, 25a on the gate insulative film 13 and the magnesium nitride films 23b, 25b formed respectively at the boundary between the copper-magnesium alloy films 23a, 25a, and the gate insulative film 13 (silicon nitride).

A fourth embodiment is to be described with reference to FIG. 13. On the inner surface of a substrate 10, a scanning signal line 22, a pixel electrode 17, a pixel electrode connection portion 27, a gate insulative film 13, and a protection insulative film 16 are disposed. Thin film transistors are formed corresponding to intersections between scanning signal lines 22 and image signal lines. An alignment film is disposed on the innermost surface and a polarizer film is disposed on the outer surface of an active matrix substrate but they are not illustrated. The thin film transistor has a drain electrode (including image signal line, image signal line terminal) 23, source electrode 25, and gate electrode (served both as scanning signal line 22). The pixel electrode 17 is connected with the source electrode 25 of the thin film transistor by way of the through hole 19.

The scanning signal line 22 includes a copper-manganese alloy film 22a on the transparent conductive film 12 and a manganese oxide film 22b formed at the boundary between the copper-manganese alloy film 22a and the transparent conductive film 12.

The drain electrode 23 has an electrode portion 23-1 formed by way of the contact layer 15 above the semiconductor layer 14 and a peripheral portion 23-2 to the outside thereof. In the same manner, the source electrode 25 has an electrode portion 25-1 formed by way of the contact layer 15 above the semiconductor layer 14 and a peripheral portion 25-2 to the outside thereof.

The gate insulative film 13 and the protection insulative film 16 are formed of silicon nitride $Si_3N_4$. The semiconductor layer 14 is formed of amorphous silicon a-Si. The contact layer 15 is formed of n⁺ type amorphous silicon n⁺ a-Si.

The drain electrode portion 23-1 and the source electrode portion 25-1 include the copper-manganese alloy films 23a, 25a on the contact layer 15 and the manganese silicide film 23b, 25b formed respectively at the boundary between the copper-manganese alloy films 23a, 25a and the contact layer 15 (n⁺ type amorphous silicon).

The drain electrode peripheral portion 23-2 and the source electrode peripheral portion 25-2 include the copper-manganese alloy films 23a, 25a above the gate insulative film 13. The pixel electrode connection portion 27 includes the copper-manganese alloy film 25a on the transparent conductive film 12 as the pixel electrode 17, and a manganese oxide film 27b formed at a boundary between the copper-manganese alloy film 25a and the transparent conductive film 12 (indium oxide or zinc oxide).

A fifth embodiment is to be described with reference to FIG. 14. On the inner surface of a substrate 10, a scanning signal line (including gate electrode and scanning signal line terminal) 28, a gate insulative film 13, a semiconductor layer 14, a contact layer 15, a pixel electrode 17, a drain electrode (including image signal line and image signal line terminal) 23, a source electrode 25, and a protection insulative film 16 are disposed. An alignment film is disposed on the innermost surface and a polarizer film is disposed on the outer surface of the active matrix substrate but they are not illustrated.

A thin film transistor is formed corresponding to the intersection between the scanning signal line 28 and the image signal line. The thin film transistor has the drain electrode 23, the source electrode 25, and the gate electrode (also served as the scanning line 28). The pixel electrode 17 is connected by way of the through hole 19 to the source electrode 25 of the thin film transistor.

In this embodiment, the transparent conductive film 12 constituting a pixel electrode 17 extends below the drain electrode 23 and the source electrode 25, and so as to cover a portion above the contact layer 15.

The gate insulative film 13 and the protection insulative film 16 are formed of silicon nitride $Si_3N_4$. The semiconductor layer 14 is formed of amorphous silicon a-Si. The contact layer 15 is formed of n⁺ type amorphous silicon n⁺ a-Si.

The scanning signal line 28 includes a copper-magnesium alloy film 28a above the glass substrate 10, a magnesium oxide film 28c formed at the boundary between the copper-magnesium alloy film 28a and the glass substrate 10, and a magnesium nitride film 28b formed at the boundary between the copper-magnesium alloy film 28a and the gate insulative film 13.

The drain electrode 23 and the source electrode 25 include the copper-manganese alloy films 23a, 25a above the transparent conductive film 12 as the pixel electrode 17, and manganese oxide films 23b, 25b formed at the boundary between the copper-manganese alloy films 23a, 25a and the transparent conductive film 12.

While embodiments of the invention have been described above, the invention is not restricted to such embodiments and it will be apparent to those skilled in the art that various modifications are possible within the range of the invention described in the scope of the claims.

The present invention can be utilized not only to the active matrix type liquid crystal display device driven by the thin film transistor but also to liquid crystal televisions or liquid crystal monitors of other types. Further, the invention is applicable also to organic light emission diode display devices.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A liquid crystal display device, comprising:
   a pair of substrates;
   liquid crystals put between the pair of substrates;
   a plurality of scanning signal lines formed on one of the pair of substrates;
   a plurality of image signal lines crossing the scanning signal lines in a matrix form;
   thin film transistors formed corresponding to intersections between the scanning signal lines and the image signal lines;
   pixel electrodes connected to the thin film transistors;
   a gate insulative film covering the scanning signal lines; and
   a protection insulative film covering the image signal lines and the thin film transistors;
   wherein the scanning signal line includes a multi-layer film including a copper alloy film formed on a transparent conductive film comprising an indium oxide as a main ingredient, and a metal oxide film of an additive metal element of the copper alloy formed between the transparent conductive film and the copper alloy film,
   the diffusion coefficient of the additive metal element of the copper alloy in copper being higher than the self-diffusion coefficient of copper, the chemical potential of oxygen gas at equilibrium of oxidation of the additive metal element of the copper alloy being lower than the chemical potential of oxygen gas at equilibrium of oxidation of indium, and the solid solubility of the additive metal element of the copper alloy in copper being greater than 0.1%.

2. The liquid crystal display device according to claim 1, wherein the additive metal element of the copper alloy comprises one or more elements selected from aluminum, beryllium, chromium, gallium, magnesium, manganese, titanium, vanadium, and zinc.

3. A liquid crystal display device, comprising:
a pair of substrates;
liquid crystals put between the pair of substrates;
a plurality of scanning signal lines formed on one of the pair of substrates;
a plurality of image signal lines crossing the scanning signal lines in a matrix form;
thin film transistors formed corresponding to intersections between the scanning signal lines and the image signal lines;
pixel electrodes connected to the thin film transistors;
a gate insulative film covering the scanning signal lines; and
a protection insulative film covering the image signal lines and the thin film transistors;
wherein the scanning signal line includes a multi-layer film including a copper alloy film formed on a transparent conductive film comprising an zinc oxide as a main ingredient and a metal oxide film of an additive metal element of the copper alloy formed between the transparent conductive film and the copper alloy film,
the diffusion coefficient of the additive metal element of the copper alloy in copper being higher than the self-diffusion coefficient of copper, the chemical potential of oxygen gas at equilibrium of oxidation of the additive metal element of the copper alloy being lower than the chemical potential of oxygen gas at equilibrium of oxidation of zinc, and the solid solubility of the additive metal element of the copper alloy in copper being greater than 0.1%.

4. The liquid crystal display device according to claim 3, wherein the additive metal element of the copper alloy comprises one or more elements selected from aluminum, beryllium, chromium, gallium, magnesium, manganese, titanium, and vanadium.

5. The liquid crystal display device according to claim 1, wherein the liquid crystal display device is an in-plane-switching type, in which the content of the additive metal element of the copper alloy film formed above the transparent conductive film is 0.5 at % or more and 2 at % or less.

6. The liquid crystal display device according to claim 1, wherein the thickness of the metal oxide film formed between the transparent conductive film and the copper alloy film is within a range from 0.5 nm to 3 nm.

7. The liquid crystal display device according to claim 1, wherein the electric resistivity of the scanning signal line is lower than 3.7 μΩcm.

8. A liquid crystal display device, comprising:
a pair of substrates;
liquid crystals put between the pair of substrates;
a plurality of scanning signal lines formed on one of the pair of substrates;
a plurality of image signal lines crossing the scanning signal lines in a matrix form;
thin film transistors formed corresponding to intersections between the scanning signal lines and the image signal lines;
pixel electrodes connected to the thin film transistors;
a gate insulative film covering the scanning signal lines; and
a protection insulative film covering the image signal lines and the thin film transistors;
wherein the gate insulative film comprises a silicon nitride, and
wherein the image signal line includes a multi-layer film including a copper alloy film formed above the gate insulative film and a metal nitride film of an additive metal element of the copper alloy formed between the gate insulative film and the copper alloy film,
the diffusion coefficient of the additive metal element of the copper alloy in copper being higher than the self-diffusion coefficient of copper, the chemical potential of nitrogen gas at equilibrium of nitridation of the additive metal element of the copper alloy being lower than the chemical potential of nitrogen gas at equilibrium of nitridation of silicon, and the solid solubility of the additive metal element of the copper alloy in copper being greater than 0.1%.

9. The liquid crystal display device according to claim 8, wherein the additive metal element of the copper alloy comprises one or more elements selected from aluminum, beryllium, magnesium, titanium, and vanadium.

10. A liquid crystal display device, comprising:
a pair of substrates;
liquid crystals put between the pair of substrates;
a plurality of scanning signal lines formed on one of the pair of substrates;
a plurality of image signal lines crossing the scanning signal lines in a matrix form;
thin film transistors formed corresponding to intersections between the scanning signal lines and the image signal lines;
pixel electrodes connected to the thin film transistors;
a gate insulative film covering the scanning signal lines; and
a protection insulative film covering the image signal lines and the thin film transistors;
wherein the thin film transistor has a semiconductor layer comprising amorphous silicon, a contact layer thereover comprising $n^+$ type amorphous silicon and a drain electrode and a source electrode thereabove,
the drain electrode and the source electrode including a multi-layer film including a copper alloy film formed above the contact layer and a silicide film of an additive metal element of the copper alloy formed between the contact layer and the copper alloy film,
the diffusion coefficient of the additive metal element of the copper alloy in copper being higher than the self-diffusion coefficient of copper, the Gibbs free energy of formation of the silicide of the additive metal element of the copper alloy being negative, and the solid solubility of the additive metal element of the copper alloy in copper being greater than 0.1%.

11. The liquid crystal display device according to claim 10, wherein the additive metal element of the copper alloy comprises one or more elements selected from chromium, magnesium, manganese, titanium, and vanadium.

12. The liquid crystal display device according to claim 1, wherein the liquid crystal display device is an in-plane-switching type further having a common transparent electrode formed in a pixel region surrounded by the scanning signal lines and the image signal lines, and a common signal line connected to the common transparent electrode in adjacent to and parallel with the scanning signal lines.

13. A liquid crystal display device, comprising:
a pair of substrates;
liquid crystals put between the pair of substrates;
a plurality of scanning signal lines formed on one of the pair of substrates;
a plurality of image signal lines crossing the scanning signal lines in a matrix form;
thin film transistors comprising silicon nitride formed corresponding to intersections between the scanning signal lines and the image signal lines;
pixel electrodes connected to the thin film transistors;
a gate insulative film covering the scanning signal lines; and
a protection insulative film covering the image signal lines and the thin film transistors;
wherein the scanning signal line includes a multi-layer film including a copper alloy film formed above a glass substrate, a metal oxide film of an additive metal element of the copper alloy formed between the glass substrate and the copper alloy film, and a metal nitride film of an additive metal element of the copper alloy formed between the copper alloy film and the gate insulative film,
the diffusion coefficient of the additive metal element of the copper alloy in copper being higher than the self-diffusion coefficient of copper, the chemical potential of oxygen gas at equilibrium of oxidation of the additive metal element of the copper alloy being lower than the chemical potential of oxygen gas at equilibrium of oxidation of indium, the chemical potential of nitrogen gas at equilibrium of nitridation of the additive metal element of the copper alloy being lower than the chemical potential of nitrogen gas at equilibrium of nitridation of silicon, and the solid solubility of the additive metal element of the copper alloy in copper being greater than 0.1%.

14. A method of manufacturing an in-plane-switching type liquid crystal display device having thin film transistors formed corresponding to intersections between scanning signal lines and image signal lines, a common transparent electrode formed in pixel regions surrounded by the scanning signal lines and the image signal lines, pixel electrodes formed in the pixel regions and connected to the thin film transistors, in which molecules of liquid crystals are driven by a voltage applied between the common transparent electrode and the pixel electrode, the method comprising the steps of;
a first photolithographic step of forming, above a substrate, a first transparent conductive film comprising an indium oxide or zinc oxide and a first copper alloy film containing a first additive metal element in this order successively by sputtering, and forming a common transparent electrode having a first transparent conductive film and a first copper alloy film in a predetermined region above the substrate by photolithography using a half photomask,
a second photolithographic step of forming a silicon nitride film, an amorphous silicon film and an $n^+$ type amorphous silicon film successively in this order so as to cover the first transparent conductive film and the first copper alloy film by plasma-enhanced chemical vapor deposition, and forming an island-like pattern containing a gate insulative film comprising silicon nitride, a semiconductor layer comprising amorphous silicon, and a contact layer comprising $n^+$ type amorphous silicon by photolithography using a binary photomask,
a third photolithographic step of forming a second copper alloy film containing a second additive metal element so as to cover the island-like pattern by sputtering, and forming the second copper alloy film in a region for forming a drain electrode and a source electrode by photolithography using a binary photomask,
a fourth photolithographic step of forming a silicon nitride film so as to cover the second copper alloy film by plasma-enhanced chemical vapor deposition, and forming a protection insulative film comprising silicon nitride by photolithography using a binary photomask, and
a fifth photolithographic step of forming a second transparent conductive film comprising an indium oxide or zinc oxide so as to cover the protection insulative film by sputtering, and forming a pixel electrode comprising the second transparent conductive film, a scanning signal line terminal, a common signal line terminal, and an image signal line terminal by photolithography using a binary photomask.

15. The method of manufacturing an in-plane-switching type liquid crystal display device according to claim 14,
wherein an oxide film of the first additive metal element is formed between the first transparent conductive film and the first copper alloy film, which are formed in the first photolithographic step, when the silicon nitride film, the amorphous silicon film, and the $n^+$ type amorphous silicon film are formed in the second photolithographic step.

16. The method of manufacturing an in-plane-switching type liquid crystal display device according to claim 14, wherein,
a silicide film of the second additive metal element is formed between the contact layer formed by the second photolithographic step and the second copper alloy film formed by the third photolithographic step when the protection insulative film is formed in the fourth lithographic step.

17. The method of manufacturing an in-plane-switching type liquid crystal display device according to claim 14,
wherein a nitride film of the second additive metal element is formed between the gate insulative film formed in the second photolithographic step and the second copper alloy film formed in the third photolithographic step when the protection insulative film is formed in the fourth photolithographic step.

18. A method of manufacturing an in-plane-switching type liquid crystal display device having thin film transistors formed corresponding to intersections between scanning signal lines and image signal lines, a common transparent electrode formed in pixel regions surrounded by scanning signal lines and the image signal lines, pixel electrodes formed in the pixel regions and connected to the thin film transistors, in which molecules of liquid crystals are driven by a voltage applied between the common transparent electrode and the pixel electrode, the method comprising the steps of;
a first photolithographic step of forming, above a substrate, a first transparent conductive film comprising an indium oxide or zinc oxide and a first copper alloy film containing a first additive metal element in this order successively by sputtering, and forming a common transparent electrode having a first transparent conductive film and a first copper alloy film to a predetermined region above the substrate by photolithography using a half photomask, a second photolithographic step of forming a silicon nitride film, an amorphous silicon film, and an n⁺ type amorphous silicon film successively in this order so as to cover the first transparent conductive film and the first copper alloy film by plasma-enhanced chemical vapor deposition, then forming a second copper alloy film containing a second additive metal element by sputtering, and forming an island-like pattern including a gate insulative film comprising silicon nitride, a semiconductor layer comprising amorphous silicon, a contact layer comprising n⁺ type amorphous silicon and a drain electrode and a source electrode, the drain electrode and the source electrode comprising the second copper alloy film, by photolithography using a half photomask, a third photolithographic step of forming a silicon nitride film by plasma-enhanced chemical vapor deposition so as to cover the island-like pattern, and forming a protection insulative film comprising silicon nitride by photolithography using a binary photomask, and a fourth photolithographic step of forming a second transparent conductive film comprising an indium oxide or zinc oxide so as to cover the protection insulative film by sputtering, and forming a pixel electrode, a scanning signal line terminal, a common signal line terminal, and an image signal line terminal, the pixel electrode, the scanning signal line terminal, the common signal line terminal, and the image signal line terminal comprising the second transparent conductive film, by photolithography using a binary photo-mask.

19. The method of manufacturing an in-plane-switching type liquid crystal display device according to claim 18,
wherein an oxide film of the first additive metal element is formed between the first transparent conductive film and the first copper alloy film, which are formed in the first photolithographic step, when the silicon nitride film, the amorphous silicon film, and the n⁺ type amorphous silicon film are formed in the second photolithographic step.

20. The method of manufacturing an in-plane-switching type liquid crystal display device according to claim 18,
wherein a silicide film of the second additive metal element is formed between the contact layer and the second copper alloy film, which are formed in the second photolithographic step, when the protection insulative film is formed in the third photolithographic step.

* * * * *